United States Patent
Tseng et al.

(10) Patent No.: US 10,217,696 B2
(45) Date of Patent: Feb. 26, 2019

(54) NON-BRIDGING CONTACT VIA STRUCTURES IN PROXIMITY

(71) Applicant: International Business Machines Corporation, Armonk, NY (US)

(72) Inventors: Chiahsun Tseng, Wynantskill, NY (US); Jin Liu, Chappaqua, NY (US); Lei Zhuang, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/811,198

(22) Filed: Nov. 13, 2017

(65) Prior Publication Data
US 2018/0068929 A1    Mar. 8, 2018

Related U.S. Application Data

(60) Continuation of application No. 14/884,076, filed on Oct. 15, 2015, now Pat. No. 9,941,191, which is a division of application No. 13/443,963, filed on Apr. 11, 2012, now Pat. No. 9,245,788.

(51) Int. Cl.
| | |
|---|---|
| H01L 21/768 | (2006.01) |
| H01L 23/48 | (2006.01) |
| H01L 21/74 | (2006.01) |
| H01L 21/033 | (2006.01) |
| H01L 21/308 | (2006.01) |
| H01L 21/311 | (2006.01) |

(52) U.S. Cl.
CPC ........ *H01L 23/481* (2013.01); *H01L 21/0337* (2013.01); *H01L 21/3086* (2013.01); *H01L 21/31144* (2013.01); *H01L 21/743* (2013.01); *H01L 21/76816* (2013.01); *H01L 21/76829* (2013.01); *H01L 21/76897* (2013.01); *H01L 2924/0002* (2013.01)

(58) Field of Classification Search
CPC .............................. H01L 21/768; H01L 23/48
See application file for complete search history.

(56) References Cited

U.S. PATENT DOCUMENTS

| | | |
|---|---|---|
| 5,932,928 A | 8/1999 | Clampitt |
| 6,184,552 B1 | 2/2001 | Kalnitsky et al. |
| 6,313,029 B1 | 11/2001 | Kim |
| 6,518,133 B1 | 2/2003 | See et al. |
| 7,253,099 B2 | 8/2007 | Hwang et al. |

(Continued)

*Primary Examiner* — Joseph C Nicely
*Assistant Examiner* — Lamont Koo
(74) *Attorney, Agent, or Firm* — Scully, Scott, Murphy & Presser, P.C.; Steven J. Meyers

(57) ABSTRACT

A first photoresist layer is patterned with a first pattern that includes an opening in a region between areas of two adjacent via holes to be formed. The opening in the first photoresist is transferred into a template layer to form a line trench therein. The lateral dimension of the trench is reduced by depositing a contiguous spacer layer that does not fill the trench completely. An etch-resistant material layer is conformally deposited and fills the trench, and is subsequently recessed to form an etch-resistant material portion filling the trench. A second photoresist layer is applied and patterned with a second pattern, which includes an opening that includes areas of two via holes and an area therebetween. A composite pattern of an intersection of the second pattern and the complement of the pattern of the etch-resistant material portion is transferred through the template layer.

10 Claims, 24 Drawing Sheets

(56) References Cited

U.S. PATENT DOCUMENTS

| | | |
|---|---|---|
| 7,605,079 B2 | 10/2009 | Lai et al. |
| 7,615,496 B2 | 11/2009 | Lee et al. |
| 7,635,896 B2 | 12/2009 | Montanini et al. |
| 2002/0140039 A1 | 10/2002 | Adkisson et al. |
| 2005/0263832 A1 | 12/2005 | Chambers |
| 2007/0045748 A1 | 3/2007 | Booth, Jr. et al. |
| 2008/0093710 A1 | 4/2008 | Bach |
| 2008/0142839 A1 | 6/2008 | Fukutome et al. |
| 2009/0068826 A1 | 3/2009 | Taniguchi |
| 2009/0121212 A1 | 5/2009 | Zahorik |
| 2009/0294976 A1 | 12/2009 | Lee |
| 2010/0130019 A1 | 5/2010 | Ohuchi |
| 2010/0193966 A1 | 8/2010 | Kim et al. |
| 2011/0070738 A1 | 3/2011 | Liang et al. |
| 2011/0189851 A1 | 8/2011 | Jeong et al. |
| 2012/0025266 A1 | 2/2012 | Griebenow et al. |
| 2012/0153481 A1 | 6/2012 | Ahn |

NON-BRIDGING CONTACT VIA STRUCTURES IN PROXIMITY

BACKGROUND

The present disclosure relates to semiconductor processing methods, and particularly to methods for low damage etch process for low dielectric constant materials, and structures for effecting the same.

In a dense contact via hole array, the pitch of the contact via holes is limited by lithographic resolution. The smaller the distance between a pair of contact via holes is, the greater the probability that a physical pattern is bridged, either at a lithographic step or after a pattern transfer etch. While multi-mask patterning schemes that employ multiple lithographic masks can alleviate bridging of contact via holes as printed in each developed photoresist layer, an adjacent pair of contact via holes is prone to bridging upon transfer of multiple lithographic patterns in the photoresist layers into an underlying layer. Thus, via hole bridging poses a severe limitation in scaling of dimensions in a dense contact via hole array.

SUMMARY

A pair of laterally spaced contact via holes is formed employing two lithographic masks and a self-aligned etch-resistant material portion. A first photoresist layer is patterned with a first pattern that includes an opening in a region between areas of two adjacent via holes to be formed. The opening in the first photoresist is transferred into a template layer to form a line trench therein. The lateral dimension of the trench is reduced by depositing a contiguous spacer layer that does not fill the trench completely. An etch-resistant material layer is conformally deposited and fills the trench, and is subsequently recessed to form an etch-resistant material portion filling the trench. A second photoresist layer is applied and patterned with a second pattern, which includes an opening that includes areas of two via holes and an area therebetween. A composite pattern of an intersection of the second pattern and the complement of the pattern of the etch-resistant material portion is transferred through the template layer and through an underlying layer in a subsequent pattern transfer etch.

According to an aspect of the present disclosure, a method of forming a patterned structure is provided, which includes: forming a line trench having a first pattern in an upper portion of a template layer; forming a contiguous spacer layer within the line trench and over a top surface of the template layer; forming an etch-resistant material portion within the line trench and on sidewalls of the contiguous spacer layer; forming a patterned layer over the etch-resistant material portion and the template layer, the patterned layer having a second pattern including an opening therein; and transferring a composite pattern of an intersection of the second pattern and a complement of a pattern of the etch-resistant material portion into the template layer.

According to another aspect of the present disclosure, a structure is provided, which includes: a stack of a template layer and a contiguous spacer layer; an etch-resistant material portion overlying a recessed portion of the stack; and a pair of via structures embedded within the stack and laterally spaced by the etch-resistant material portion and the recessed portion of the stack.

DETAILED DESCRIPTION

Figure 1A:
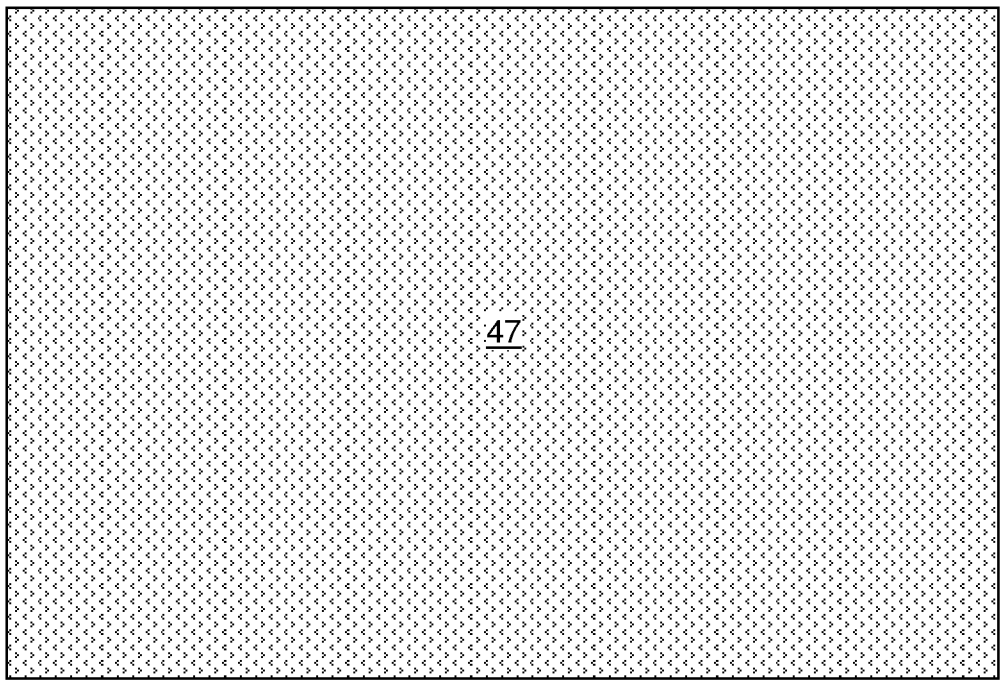
FIG. 1A is a top-down view of a first exemplary structure after application of a first photoresist layer according to a first embodiment of the present disclosure.

As stated above, the present disclosure relates to methods for forming trenches having different widths and the same depth, which are now described in detail with accompanying figures. Throughout the drawings, the same reference numerals or letters are used to designate like or equivalent elements. The drawings are not necessarily drawn to scale.

Figure 1B:
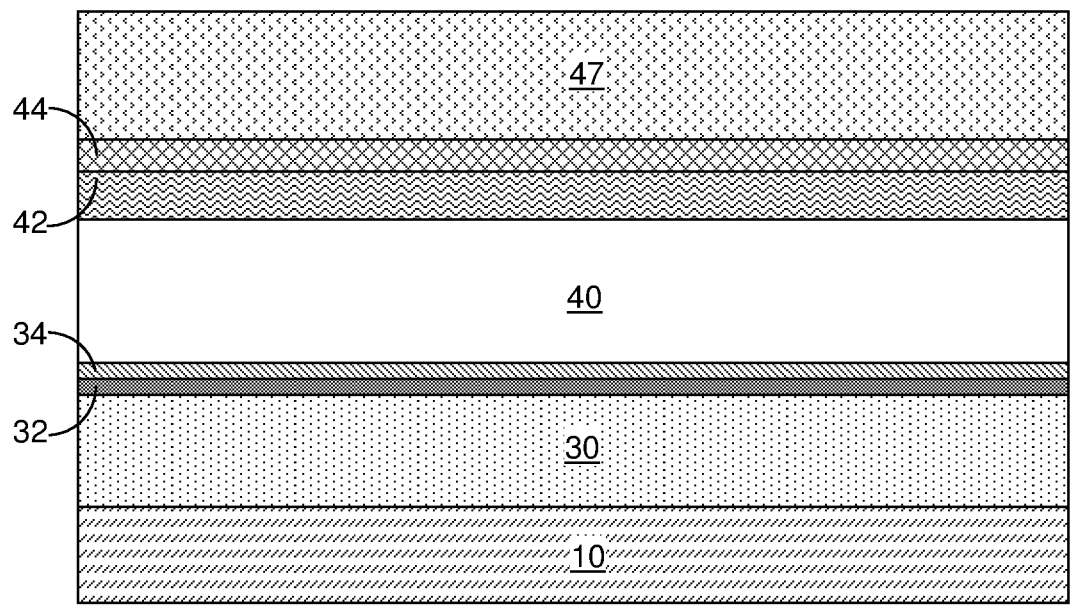
FIG. 1B is a vertical cross-sectional view of the first exemplary structure of FIG. 1A.

Referring to FIGS. 1A and 1B, a first exemplary structure according to a first embodiment of the present disclosure includes a stack of a substrate layer 10, at least one underlying material layer, a template layer 40, and at least one photosensitive-material-including layer. The at least one underlying material layer can include, for example, a dielectric material layer 30, an optional cap material layer 32, and an optional hard mask layer 34. The at least one photosensitive-material-including layer can include, for example, a stack of a first organic planarization layer 42, a first antireflective coating (ARC) layer 44, and a first photoresist layer 47.

The dielectric material layer 30 includes a dielectric material that can be employed for forming metal interconnect structures therein. For example, the dielectric material layer 30 can include undoped silicon oxide, doped silicon oxide, silicon nitride, silicon oxynitride, non-porous organosilicate glass (OSG), and porous OSG, or a combination thereof. The dielectric material layer 30 can be formed, for example, by chemical vapor deposition (CVD) or spin-coating. The dielectric material layer 30 can have a thickness from 30 nm to 1,000 nm, although lesser and greater thicknesses can also be employed.

The optional cap material layer 32 can include a dielectric material such as silicon oxide, silicon nitride, silicon oxynitride, a non-porous organosilicate glass, a nitrogen-doped non-porous organosilicate glass, or a combination thereof. In one embodiment, the optional cap material layer 32 can be employed to provide a greater mechanical strength than the material of the dielectric material layer 30 during a subsequent planarization process such as chemical mechanical planarization. Alternately or additionally, the optional cap material layer 32 can be employed to protect the dielectric material layer 30 and structures to be embedded therein from impurities that may diffuse down from upper levels, and can function as a diffusion barrier layer that prevents vertical diffusion of metallic impurities, moisture, or other gaseous impurities. The optional cap material layer 32 can be formed, for example, by chemical vapor deposition (CVD) or atomic layer deposition (ALD). The thickness of the optional cap material layer 32 can be from 2 nm to 30 nm, although lesser and greater thicknesses can also be employed.

The optional hard mask layer 34 can include a dielectric material or a conductive metallic material. For example, the optional hard mask layer 34 can include a dielectric material such as silicon oxide, silicon nitride, silicon oxynitride, a non-porous organosilicate glass, a nitrogen-doped non-porous organosilicate glass, or a combination thereof, or can include a conductive metallic material such as TiN, TaN, WN, TiC, TaC, WC, or a combination thereof. In one embodiment, the optional hard mask layer 34 can be employed as a disposable or non-disposable stopping layer during a subsequent planarization process. If the optional hard mask layer 34 is a non-disposable dielectric material, the optional hard mask layer 34 can be employed to protect the dielectric material layer 30 and structures to be embedded therein from impurities that may diffuse down from upper levels, and can function as a diffusion barrier layer that prevents vertical diffusion of metallic impurities, moisture, or other gaseous impurities. The optional hard mask layer 32 can include, for example, silicon nitride, silicon oxynitride, a nitrogen-doped organosilicate glass, or a combination thereof. The optional hard mask layer 34 can be formed, for example, by chemical vapor deposition (CVD) or atomic layer deposition (ALD). The thickness of the optional hard mask layer 34 can be from 2 nm to 30 nm, although lesser and greater thicknesses can also be employed.

The template layer 40 can include a dielectric material, a semiconductor material, and/or a conductive material. In embodiments in which a portion of the template layer 40 remains after formation of a pair of conductive via structures, the template layer 40 includes a dielectric material such as silicon oxide, silicon nitride, silicon oxynitride, porous or non-porous organosilicate glass, or a combination thereof.

In embodiment in which the entirety of the template layer 40 is subsequently removed during formation of a pair of conductive via structures, for example, by planarization, the template layer 40 can include a dielectric material, a semiconductor material, and/or a conductive material. For example, the template layer 40 can include a dielectric material such as silicon oxide, silicon nitride, silicon oxynitride, porous or non-porous organosilicate glass, or a combination thereof, and/or a semiconductor material such as silicon, germanium, or a compound semiconductor material, and/or a conductive material such as TiN, TaN, WN, TiC, TaC, WC, Al, W, or a combination thereof.

The template layer 40 can be formed, for example, by chemical vapor deposition (CVD), physical vapor deposition (PVD), atomic layer deposition (ALD), spin coating, or a combination thereof. The thickness of the template layer 40 can be from 20 nm to 500 nm, although lesser and greater thicknesses can also be employed. In one embodiment, the template layer 40 can include silicon oxide formed by chemical vapor deposition.

Each of the layers in the stack of the first organic planarization layer (OPL) 42, the first antireflective coating (ARC) layer 44, and the first photoresist layer 47 can be formed by spin coating. The first OPL 42 includes a self-planarizing organic planarization material, which can be a polymer layer with sufficiently low viscosity so that the top surface of the first OPL 42 is a planar horizontal surface. The self-planarizing organic planarization material can be any material employed for an organic planarization layer in trilayer lithography methods known in the art. The thickness of the first OPL 42 can be from 10 nm to 200 nm, although lesser and greater thicknesses can also be employed.

The first ARC layer 44 is an optional layer, and can be formed, for example, by spin coating. The first ARC layer 44 can include any anti-reflective material known in the art, and can include silicon and/or an organic material. The thickness of the first ARC layer 44 can be from 10 nm to 150 nm, although lesser and greater thicknesses can also be employed.

The first photoresist layer 47 is applied directly on the first ARC layer 44 or directly on the first OPL 42, for example, by spin coating. The thickness of the first photoresist layer 47 can be from 200 nm to 600 nm, although lesser and greater thicknesses can also be employed. The first photoresist layer 47 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

While the present disclosure is described employing the stack of the first OPL 42, the first ARC layer 44, and the first photoresist layer 47, the stack of the first OPL 42, the first ARC layer 44, and the first photoresist layer 47 can be replaced with one or more layers that include a photosensitive material as known in the art.

Figure 2A:
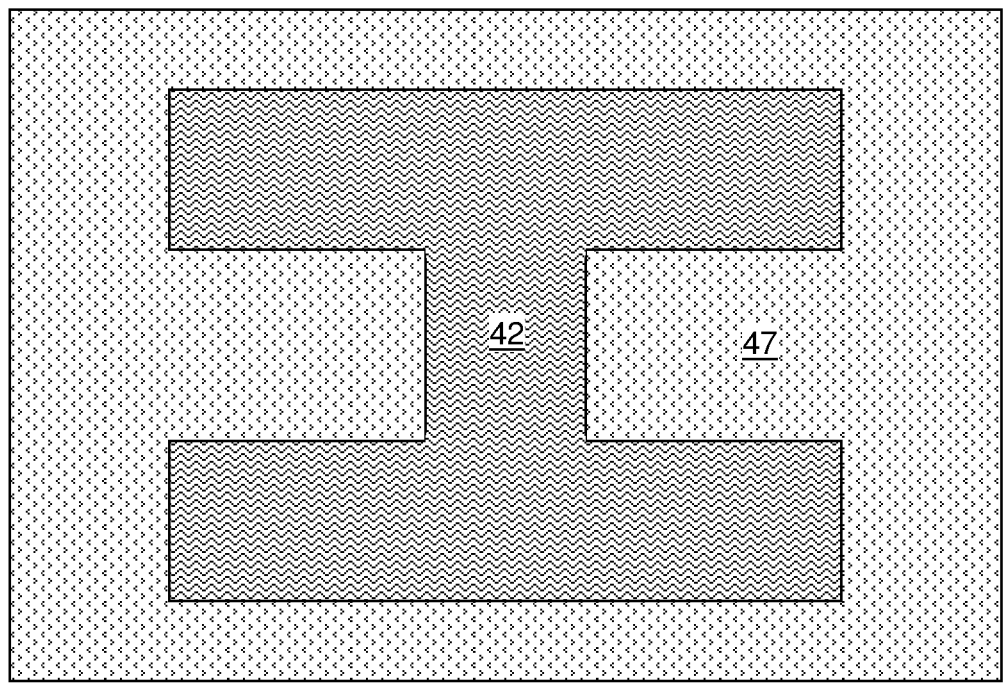
FIG. 2A is a top-down view of the first exemplary structure after patterning the first photoresist layer with a first pattern according to the first embodiment of the present disclosure.
Figure 2B:
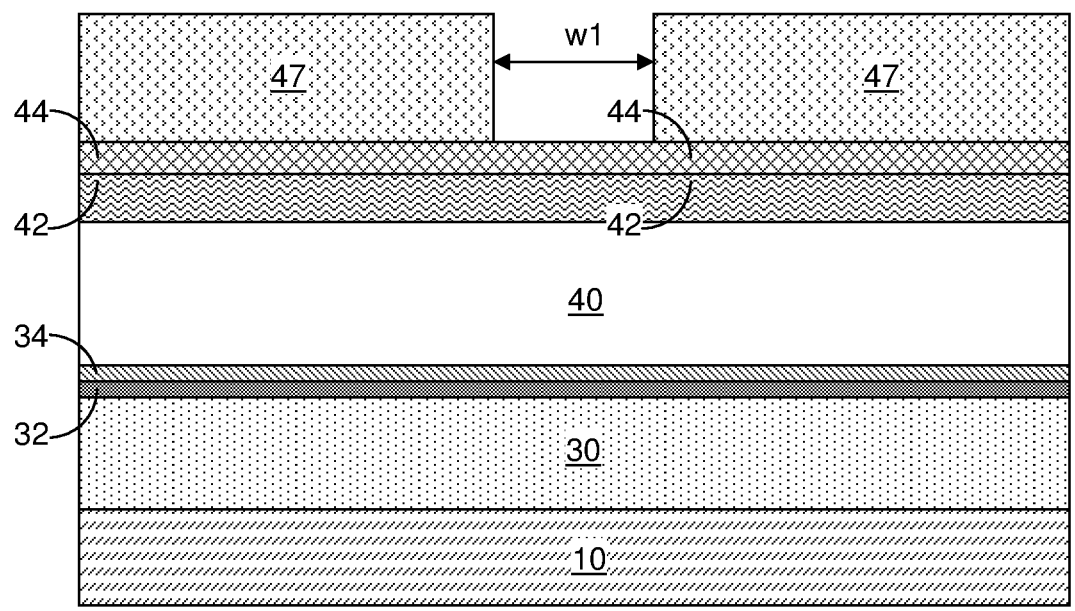
FIG. 2B is a vertical cross-sectional view of the first exemplary structure of FIG. 2A.

Referring to FIGS. 2A and 2B, the first photoresist layer 47 is patterned with a first lithographic pattern by lithographic exposure and development. The first lithographic pattern includes a line portion having a first width w1 and referred to as a "primary line portion" herein. The first lithographic pattern can further include two additional line portions that are attached to the two ends of the primary line portion and having a lengthwise direction that is perpendicular to the lengthwise direction of the primary line portion. The two additional line portions and the primary line portions can be merged to form a single contiguous opening in the photoresist layer having an overall shaped of an "H." Thus, the first lithographic pattern including the primary line portion and two adjoined additional line portions is herein referred to as an "H-shaped pattern."

Figure 3A:
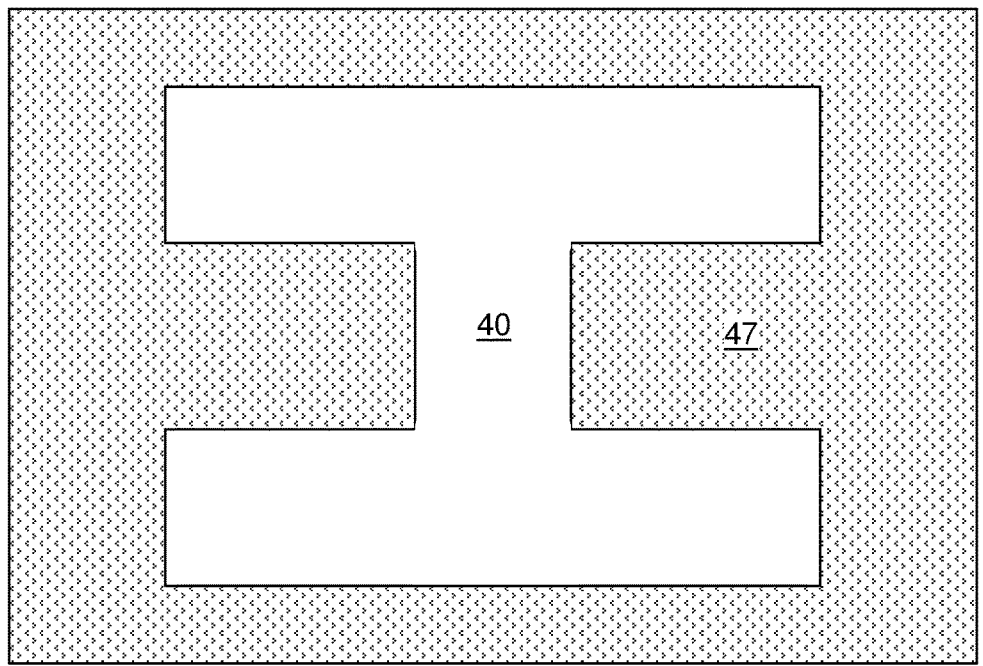
FIG. 3A is a top-down view of the first exemplary structure after transfer of the pattern in the first photoresist layer into a template layer according to the first embodiment of the present disclosure.
Figure 3B:
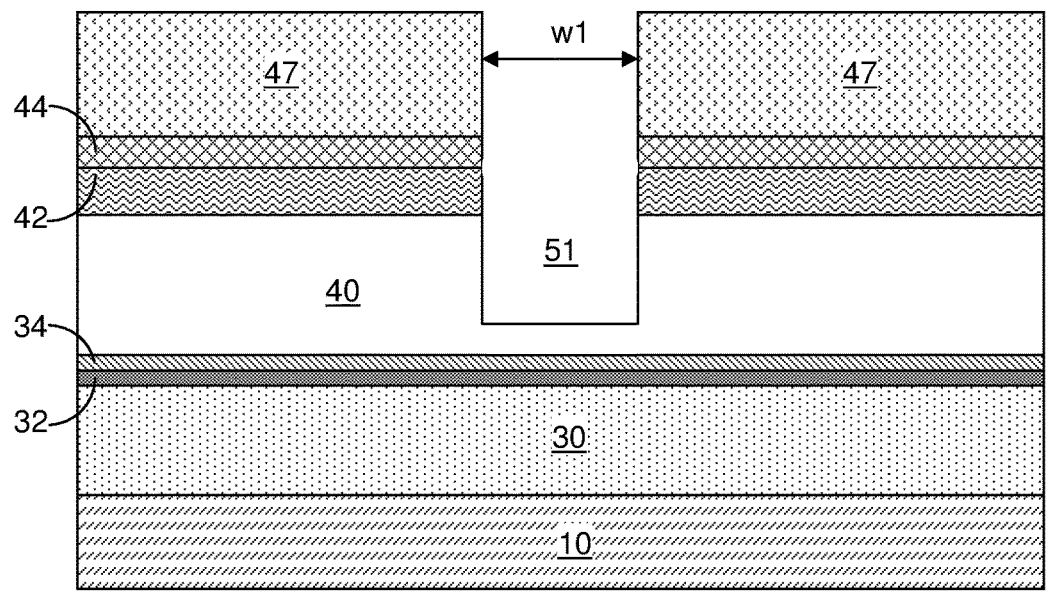
FIG. 3B is a vertical cross-sectional view of the first exemplary structure of FIG. 3A.

Referring to FIGS. 3A and 3B, the first lithographic pattern in the first photoresist layer 47 is transferred through the first ARC layer 44 and the first OPL 42 by a pattern transfer etch, which can be an anisotropic etch. In one embodiment, the pattern transfer etch can be a reactive ion etch that removes the materials of the first ARC layer 44 and the first OPL 42 employing the first photoresist layer 47 as an etch mask.

After the top surface of the template layer 40 is physically exposed within an H-shaped opening in the stack of the first OPL 42, the first ARC layer 44, and the first photoresist layer 47, another anisotropic etch process is performed to form a contiguous line trench 51 having an H-shape in an upper portion of the template layer 40. The anisotropic etch process can include any chemistry that can etch the material of the template layer 40 employing the first photoresist layer 47 as an etch mask. A primary portion of the contiguous line trench 51 underlying the primary line portion of the H-shaped pattern in the first photoresist layer 47 can have a width that is substantially the same as the first width w1. The bottom surface of the contiguous line trench 51 may, or may not, extend to the topmost surface of the at least one underlying material layer (30, 32, 34).

Figure 4A:
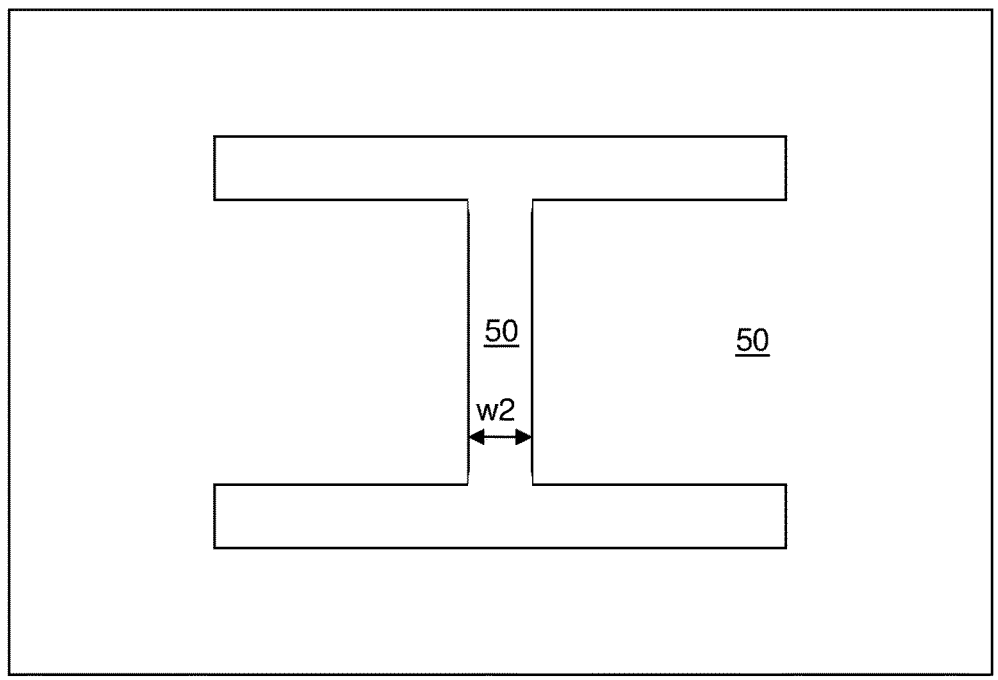
FIG. 4A is a top-down view of the first exemplary structure after formation of a contiguous spacer layer according to the first embodiment of the present disclosure.
Figure 4B:
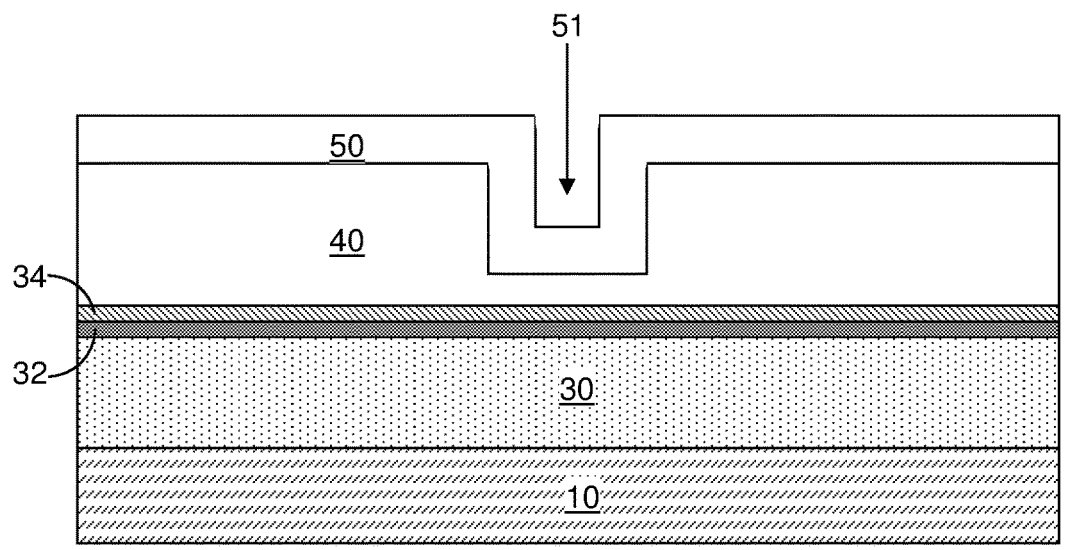
FIG. 4B is a vertical cross-sectional view of the first exemplary structure of FIG. 4A.

Referring to FIGS. 4A and 4B, the stack of the first photoresist layer 47, the first ARC layer 44, and the first OPL 42 are removed, for example, by ashing. A contiguous spacer layer 50 is formed within the contiguous line trench 51 and over the top surface of the template layer 40. The contiguous spacer layer 50 is formed as a single contiguous layer without any hole therein. In an embodiment in which at least a portion of the template layer 40 remains after subsequent formation of a pair of conductive via structures, the contiguous spacer layer 50 includes a dielectric material such as doped silicon oxide, undoped silicon oxide, silicon nitride, silicon oxynitride, organosilicate glass (OSG), or a combination thereof.

In an embodiment in which the entirety of the template layer 40 is subsequently removed after formation of a pair of conductive via structures, the contiguous spacer layer 50 can include a dielectric material, a semiconductor material, or a conductive material.

The material of the contiguous spacer layer 50 can be the same as, or different from, the material of the template layer 40. The contiguous spacer layer 50 can be formed by a conformal deposition process or by a non-conformal deposition process provided that the sidewall step coverage is non-zero. In one embodiment, the contiguous spacer layer 50 can be formed by a conformal deposition process such as low pressure chemical vapor deposition (LPCVD), and the thickness of the contiguous spacer layer 50 can be the same at all horizontal portions of the contiguous spacer layer 50. Specifically, the contiguous spacer layer 50 can have the same thickness in the recessed portion of the template layer 40 as in a non-recessed portion of the template layer 50, i.e., above the topmost surface of the template layer 40 and above the recessed surface of the template layer 40 at the bottom of the contiguous line trench 51.

The lateral thickness of vertical portions of the contiguous spacer layer 50 within the recessed portions of the template layer 40 is less than one half of the first thickness w1 so that the contiguous line trench 51 is not plugged by the contiguous spacer layer 50.

In one embodiment, the remaining portion of the contiguous line trench 51 includes a trench portion having a width, which is herein referred to as a second width w2, that is less than the first width by twice the width of vertical portions of the contiguous spacer layer 50. In one embodiment, the second width w2 can be less than a lithographically printable dimension for deep ultraviolet lithography, i.e., a sublithographic dimension for deep ultraviolet lithography, and the first width w1 can be a lithographic dimension for deep ultraviolet lithography.

Figure 5A:
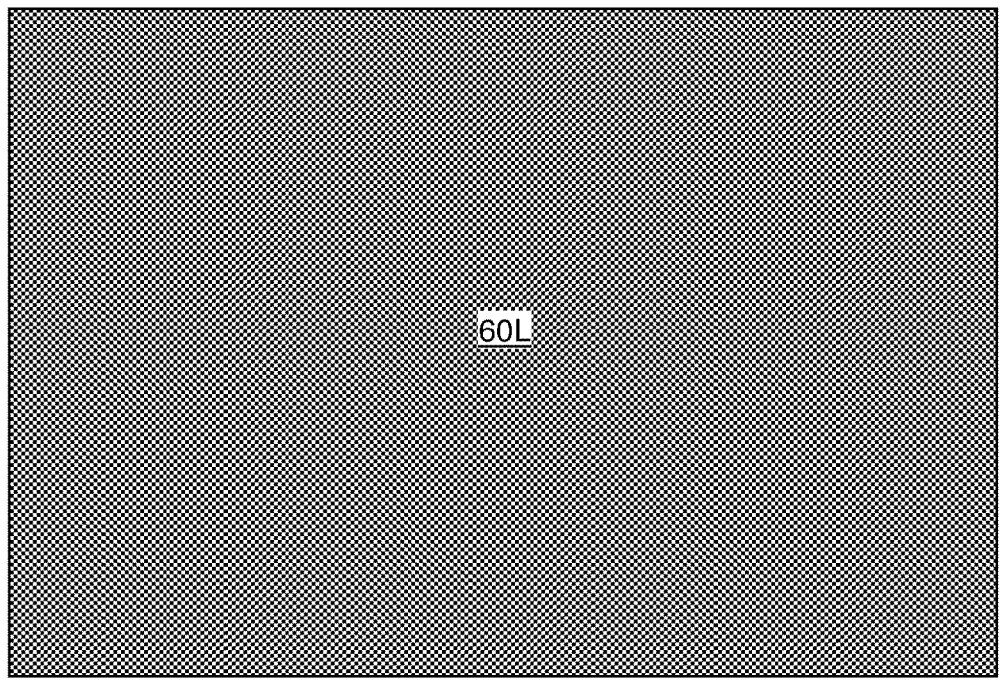
FIG. 5A is a top-down view of the first exemplary structure after formation of an etch-resistant material layer according to the first embodiment of the present disclosure.
Figure 5B:
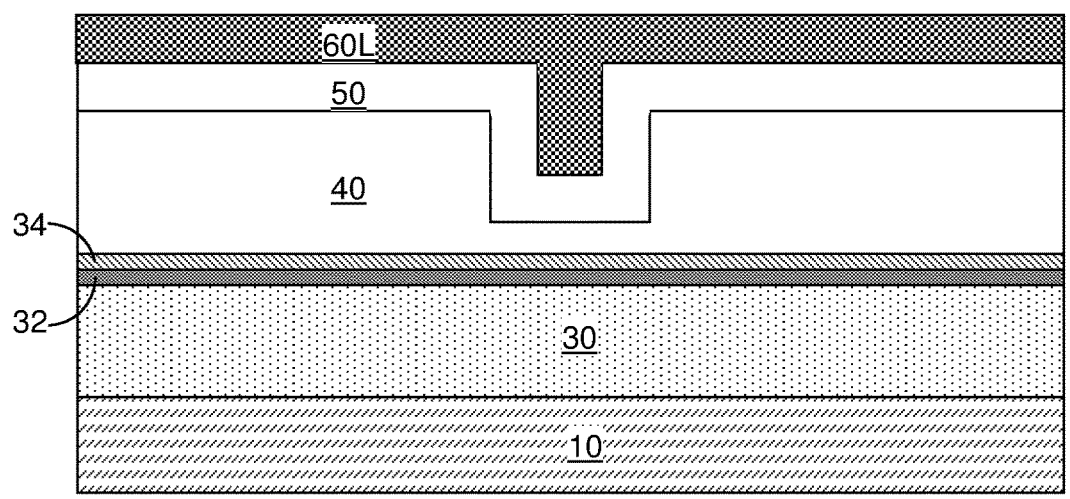
FIG. 5B is a vertical cross-sectional view of the first exemplary structure of FIG. 5A.

Referring to FIGS. 5A and 5B, an etch-resistant material layer 60L is deposited by a conformal deposition method to fill the contiguous line trench 51. The material of the etch-resistant material layer 60L is different from the material of the contiguous spacer layer 50 and from the material of the template layer 40. Specifically, the material of the etch-resistant material layer 60L is more etch-resistant to a first etch chemistry to be subsequently employed to etch the contiguous spacer layer 50, and is more etch-resistant to a second etch chemistry to be subsequently employed to etch the template layer 40.

In an embodiment in which at least a portion of the template layer 40 remains after subsequent formation of a pair of conductive via structures, the etch-resistant material layer 60L includes a dielectric material. For example, the dielectric material of the etch-resistant material layer 60L can be a dielectric metal oxide having a dielectric constant greater than 8.0 and is known as a "high-k gate dielectric material" in the art. The dielectric metal oxide can be formed, for example, by chemical vapor deposition (CVD) or atomic layer deposition (ALD). Alternately, the contiguous spacer layer 50 and the template layer 40 can include organosilicate glass materials, and the etch-resistant material layer 60L can include silicon oxide, silicon nitride, silicon oxynitride, or a nitrogen-doped organosilicate glass. Yet alternately, the contiguous spacer layer 50 and the template layer 40 can include an organosilicate glass material and/or silicon oxide, and the etch-resistant material layer 60L can include silicon nitride or silicon oxynitride.

In an embodiment in which the entirety of the template layer 40 is subsequently removed after formation of a pair of conductive via structures, the etch-resistant material layer 60L can include a dielectric material or a conductive material. The dielectric material that can be employed for the template layer 40 includes a dielectric metal oxide, silicon oxide, silicon nitride, silicon oxynitride, or a nitrogen-doped organosilicate glass, or a combination thereof. The conductive material that can be employed for the template layer 40 includes a conductive metal nitride such as TiN, TaN, and WN, a conductive metal carbide such as TiC, TaC, WC, an elemental metal such as Al, Cu, W, and combinations and stacks thereof. The conductive material for the template layer 40 can be deposited, for example, by chemical vapor deposition (CVD) or atomic layer deposition (ALD).

The thickness of the etch-resistant material layer 60L, as measured above the topmost surface of the contiguous spacer layer 50, is greater than ½ of the second width w2. The sum of the thickness of the contiguous spacer layer 50 and the thickness of the etch-resistant material layer 60L is greater than ½ of the first width w1.

Figure 6A:
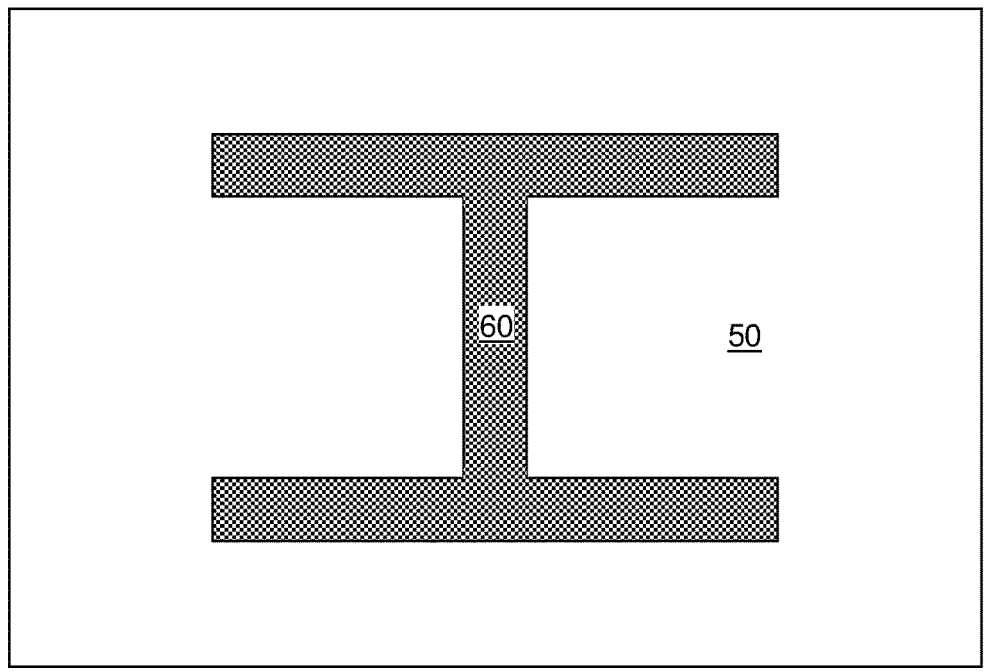
FIG. 6A is a top-down view of the first exemplary structure after recessing of the etch-resistant material layer to form an etch-resistant material portion according to the first embodiment of the present disclosure.

Referring to FIG. 6A, the etch-resistant material layer 60L is vertically recessed employing the contiguous spacer layer 50 as an etch stop layer or as an end-point detection layer. Thus, the etch-resistant material layer 60L is removed from above the topmost surface of the contiguous spacer layer 50, while a remaining portion of the etch-resistant material layer 60L is present below the topmost surface of the contiguous spacer layer 50. The remaining portion of the etch-resistant material layer 60L has the second width w2, and is herein referred to as an etch-resistant material portion 60. The etch-resistant material portion 60 is formed within the line trench and on sidewalls of the contiguous spacer layer 50. In one embodiment, the etch-resistant material portion 60 can have a sub-lithographic lateral dimension for deep ultraviolet lithography. The etch-resistant material portion 60 can have an H-shaped horizontal cross-sectional shape between the plane of the topmost surface of the contiguous spacer layer 50 and the top surface of the recessed portion of the contiguous spacer layer 50.

Figure 7A:
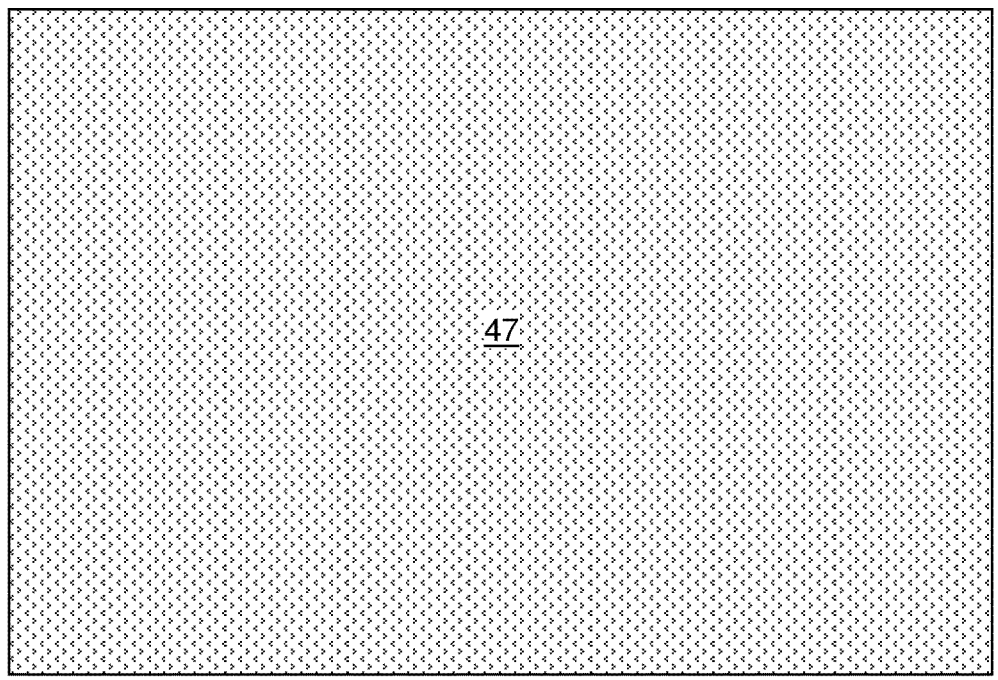
FIG. 7A is a top-down view of the first exemplary structure after application of a second photoresist layer according to the first embodiment of the present disclosure.
Figure 7B:
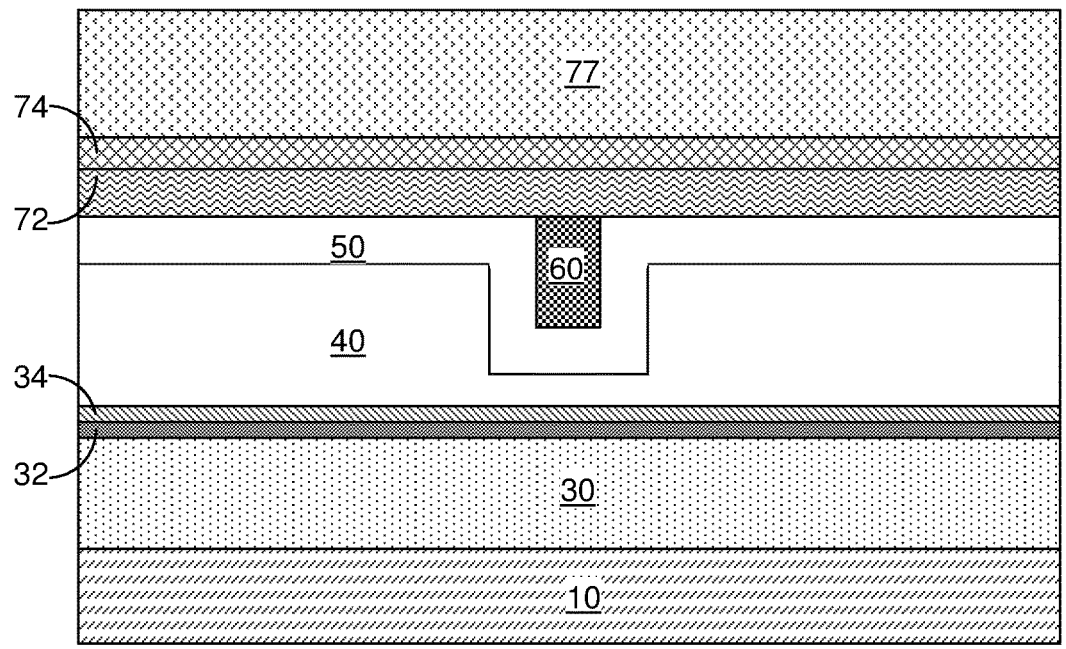
FIG. 7B is a vertical cross-sectional view of the first exemplary structure of FIG. 7A.

Referring to FIGS. 7A and 7B, a stack of a second organic planarization layer (OPL) 72, a second antireflective coating (ARC) layer 74, and a second photoresist layer 77 is formed, for example, by spin coating. The second OPL 72 can include the same type of material as the first OPL 72, and can have the same thickness range as the first OPL 42. The second ARC layer 74 can have the same type of material as the first ARC layer 44, and can have the same thickness range as the first ARC layer 44. The second photoresist layer 77 can have the same type of material as the first photoresist layer 47, and can have the same thickness range as the first photoresist layer 47.

While the present disclosure is described employing the stack of the second OPL 72, the second ARC layer 74, and the second photoresist layer 77, the stack of the second OPL 72, the second ARC layer 74, and the second photoresist layer 77 can be replaced with one or more layers that include a photosensitive material as known in the art.

Figure 8A:
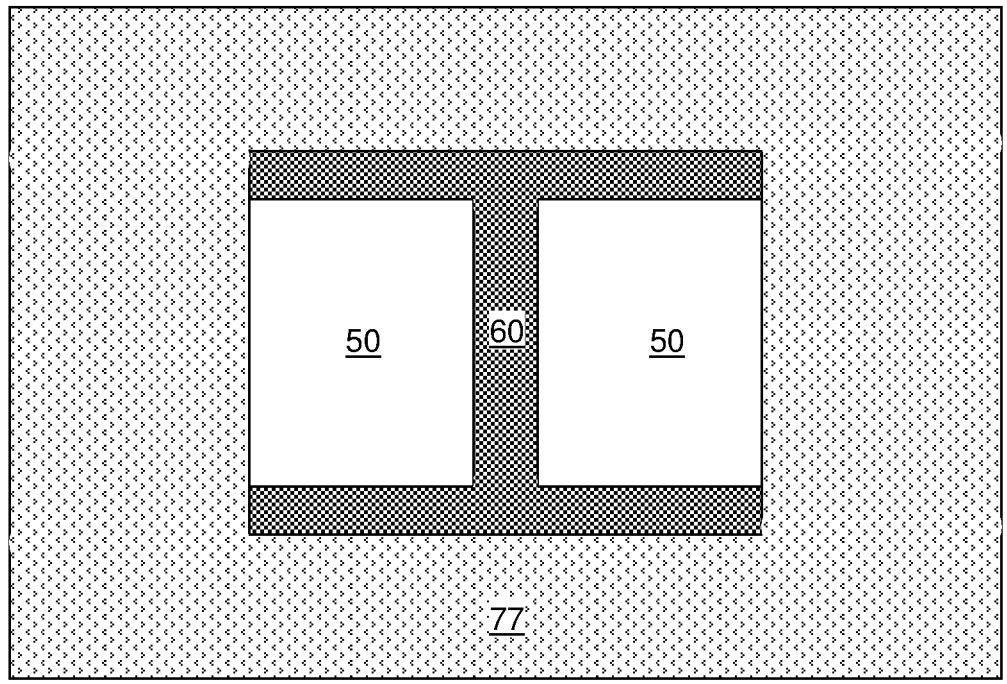
FIG. 8A is a top-down view of the first exemplary structure after patterning the second photoresist layer, a second anti-reflective coating layer, and a second organic planarization layer with a second pattern according to the first embodiment of the present disclosure.
Figure 8B:
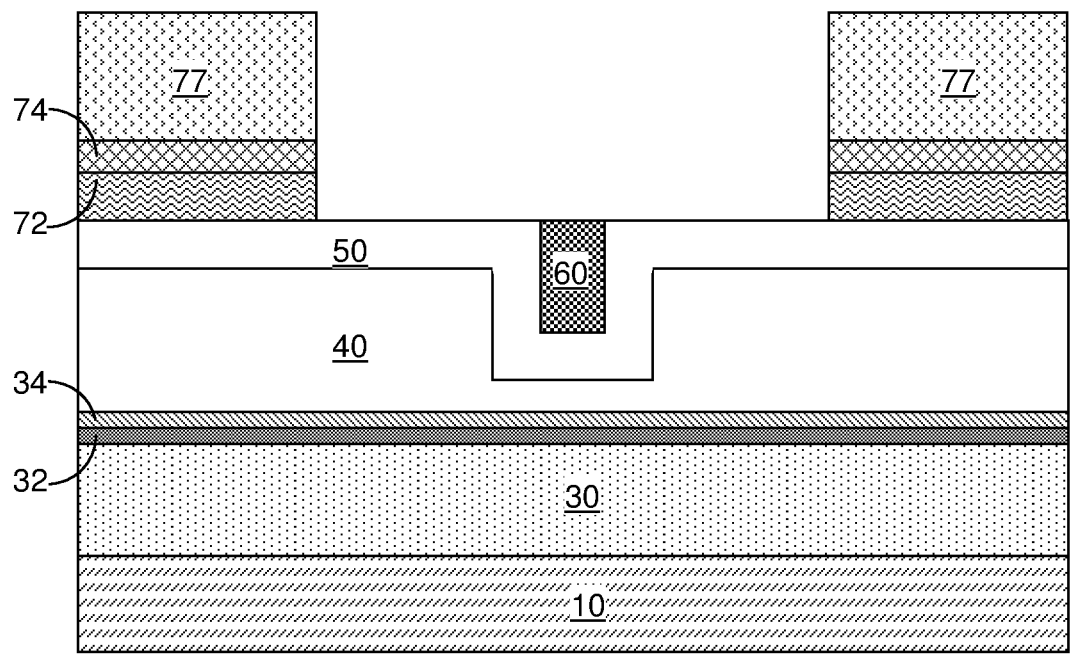
FIG. 8B is a vertical cross-sectional view of the first exemplary structure of FIG. 8A.

Referring to FIGS. 8A and 8B, the stack of the second photoresist layer 77, the second ARC layer 74, and the second OPL 72 is patterned with a second pattern. Specifically, the second photoresist layer 77 is patterned with the pattern, and the second pattern is transferred through the second ARC layer 74 and the second OPL 72 by a pattern transfer etch.

The second pattern includes an opening therein, and the opening in the second pattern straddles over a portion of the etch-resistant material portion 60. In one embodiment, the etch-resistant material portion 60 can be an H-shaped etch-resistant material portion including a primary etch-resistant line portion having the second width w2 and a pair of adjoining etch-resistant line portions that are adjoined to two ends of the primary etch-resistant line portion. In one embodiment, the opening in the second pattern can straddle over the primary etch-resistant line portion. Additionally, sidewalls of the stack of the second photoresist layer 77, the second ARC layer 74, and the second OPL 72 can overlie each of the pair of adjoining etch-resistant line portions.

In one embodiment, the opening in the second pattern can have a substantially rectangular shape, wherein a portion of the etch-resistant material portion straddles over an area of a center portion of the rectangular shape. A pair of parallel sides of the rectangle can overlie the pair of adjoining etch-resistant line portions, and another pair of parallel sides of the rectangle can be laterally spaced by a region including the entirety of the primary etch-resistant line portion.

Figure 9A:
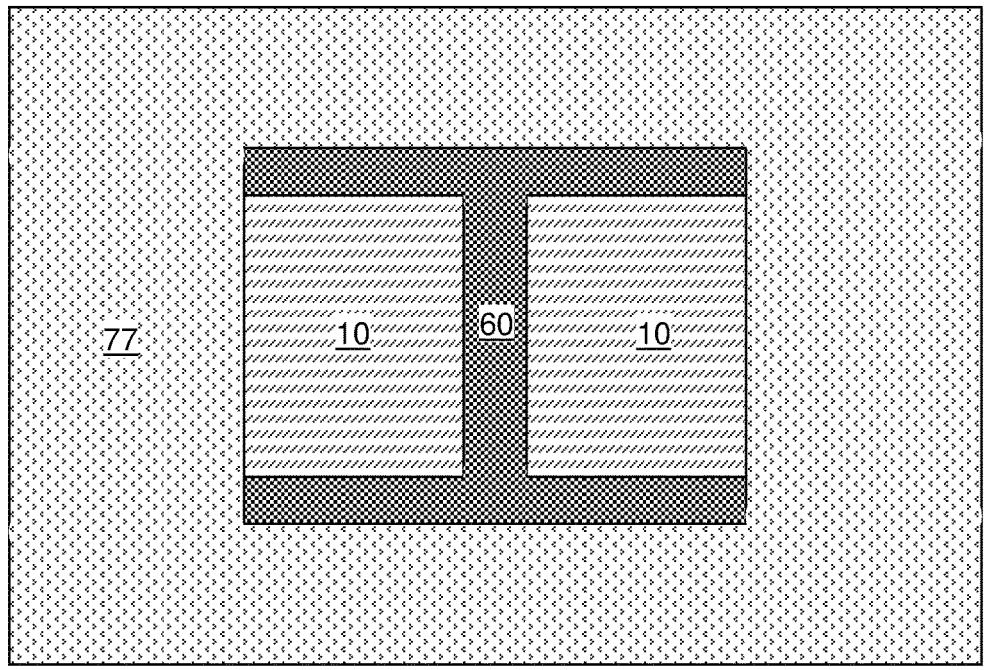
FIG. 9A is a top-down view of the first exemplary structure after transfer of a composite pattern of the intersection of the second pattern and the complement of the pattern of the etch-resistant material portion according to the first embodiment of the present disclosure.
Figure 9B:
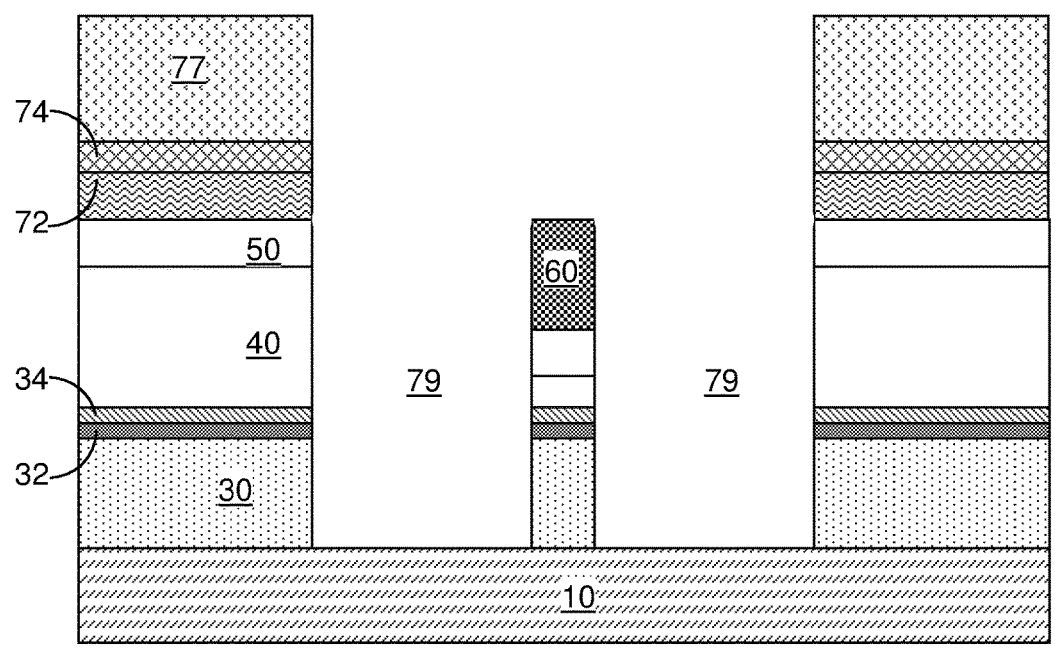
FIG. 9B is a vertical cross-sectional view of the first exemplary structure of FIG. 9A.

Referring to FIGS. 9A and 9B, a composite pattern derived from the second pattern is transferred through the stack of the contiguous spacer layer 50, the template layer 40, and optionally through the at least one underlying material layer (34, 32, 30) by an anisotropic etch that employs the combination of the second photoresist layer 77 and the etch-resistant material portion 60 as an etch mask. Because the etch-resistant material portion 60 prevents etching of materials located directly underneath during the anisotropic etch, the composite pattern formed by the anisotropic etch below the topmost surface of the contiguous spacer layer 50 is a pattern of the intersection of the second pattern and the complement of the pattern of the etch-resistant material portion 60.

The composite pattern includes a pair of via holes 79 laterally spaced by the etch-resistant material portion 60. In one embodiment, the pair of via holes 79 extends through the entirety of the template layer 40. The bottom surface of the pair of via holes 79 can protrude under the top surface of the substrate layer 10, can be coplanar with the top surface of the substrate layer 10, can be located between the bottommost surface and the topmost surface of the at least one underlying material layer (34, 32, 30), or can be coplanar with the bottommost surface of the template layer 40.

Figure 10A:
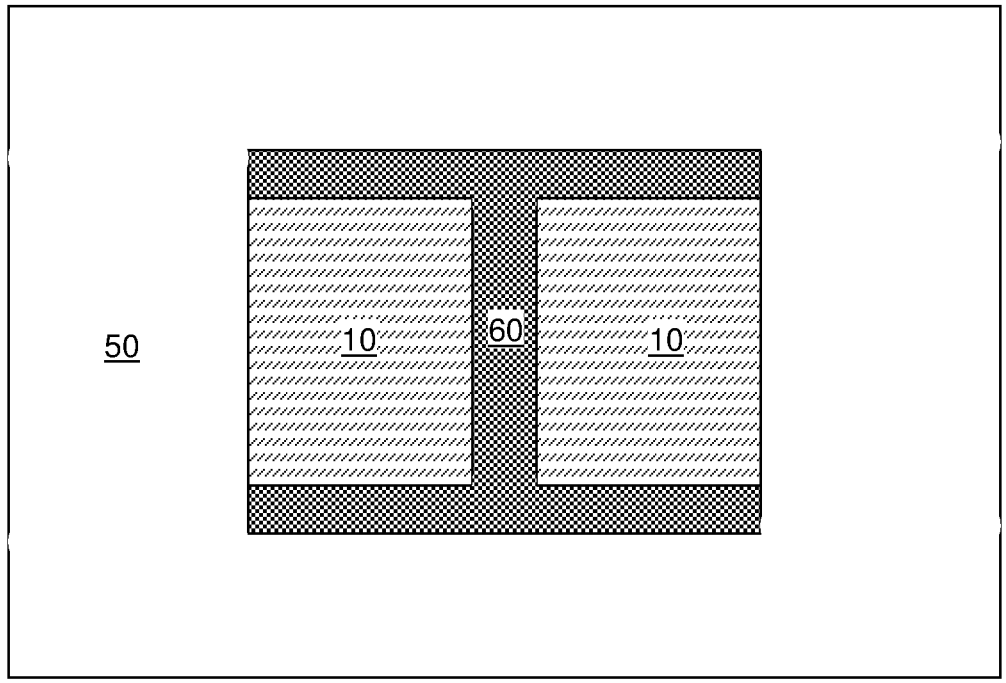
FIG. 10A is a top-down view of the first exemplary structure after removal of the second photoresist layer, the second ARC layer, and the second organic planarization layer according to the first embodiment of the present disclosure.
Figure 10B:
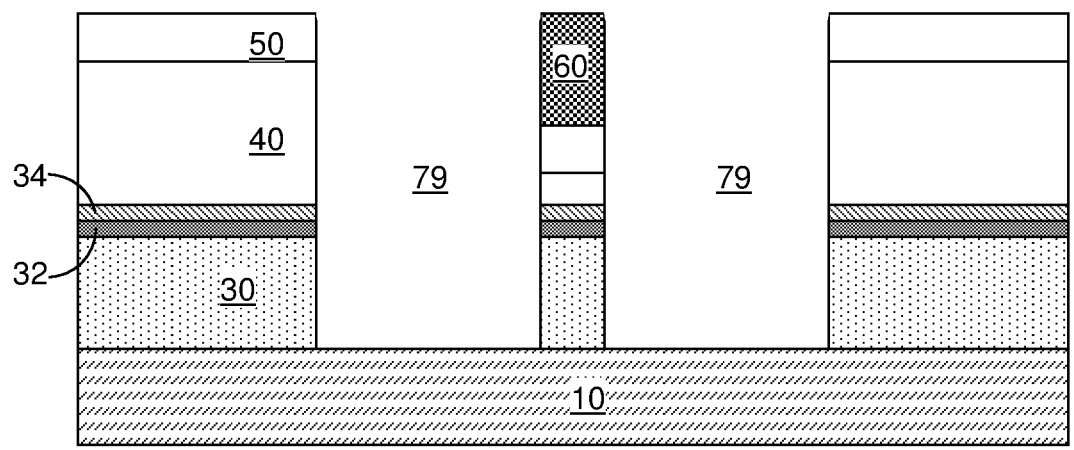
FIG. 10B is a vertical cross-sectional view of the first exemplary structure of FIG. 10A.

Referring to FIGS. 10A and 10B, the stack of the second photoresist layer 77, the second ARC layer 74, and the second OPL 72 are removed, for example, by ashing.

Figure 11A:
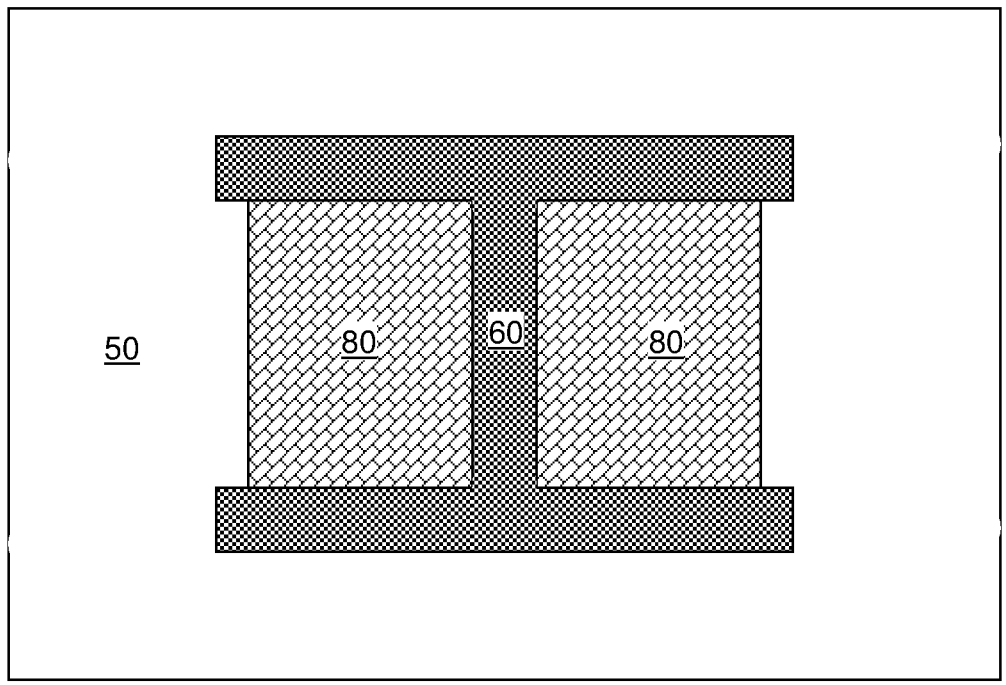
FIG. 11A is a top-down view of the first exemplary structure after formation of a pair of via structures according to the first embodiment of the present disclosure.
Figure 11B:
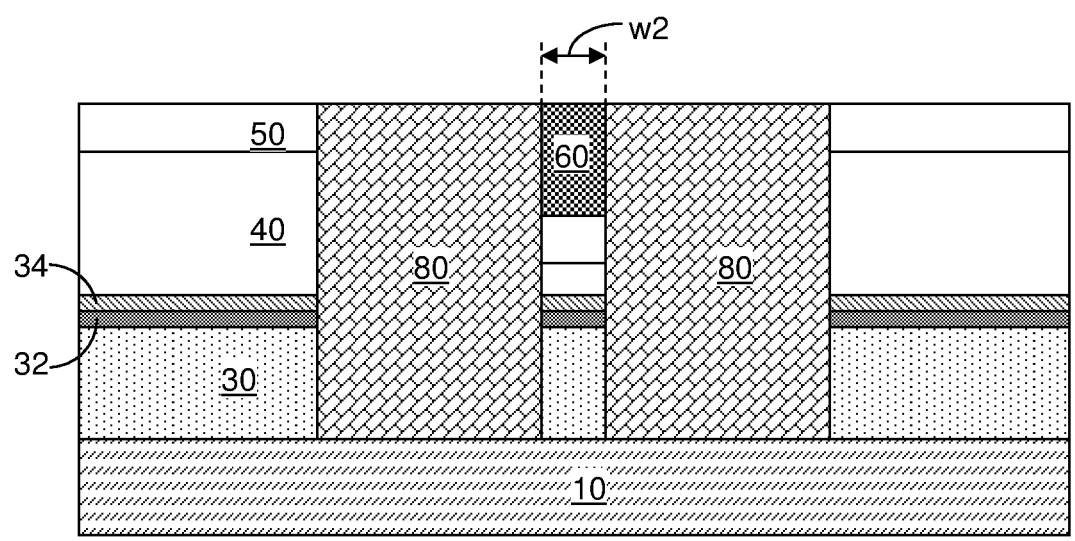
FIG. 11B is a vertical cross-sectional view of the first exemplary structure of FIG. 11A.

Referring to FIGS. 11A and 11B, a conductive material is deposited in the pair of via holes 79 and over the topmost surface of the contiguous spacer layer 50, for example, by physical vapor deposition (PVD), chemical vapor deposition (CVD), electroplating, electroless plating, or a combination thereof. The conductive material can be, for example, Cu, TiN, TaN, WN, Ti, Ta, W, Al, or an alloy or a combination thereof.

Excess conductive material deposited above the topmost surface of the contiguous spacer layer 50 and above the etch-resistant material portion 60 is removed, for example, by chemical mechanical planarization (CMP) or a recess etch. Remaining portions of the conductive material within the pair of via holes 79 constitutes a pair of via structures 80.

The structure in FIGS. 11A and 11B includes a stack of the template layer 40 and the contiguous spacer layer 50; the etch-resistant material portion 60 overlying a recessed portion of the stack; and the pair of via structures 80, embedded within the stack and laterally spaced by the etch-resistant material portion 60 and the recessed portion of the stack (40, 50). The entirety of the contiguous spacer layer 50 is contiguous, and the contiguous spacer layer 50 has the same thickness in the recessed portion of the stack (40, 50) as in the non-recessed portion of the stack (40, 50).

In one embodiment, the top surface of the contiguous spacer layer 50, the top surface of the etch-resistant material portion 60, and the top surfaces of the pair of via structures 80 can be substantially coplanar among one another. The etch-resistant material portion 60 can have an H-shaped pattern. The etch-resistant material portion 60 has a rectangular portion, i.e., the primary etch-resistant line portion having the second width w2, that laterally contacts the pair of via structures 80. The lateral extent of the pair of via structures 80 along the lengthwise direction of the primary etch-resistant material portion is bounded by a pair of parallel line portions within the H-shaped pattern, i.e., by the pair of adjoining etch-resistant line portions. The etch-resistant material portion 60 can have a sub-lithographic lateral dimension for deep ultraviolet lithography such as the second width w2. Additionally, the width of each of the pair of adjoining etch-resistant line portions can be a sub-lithographic lateral dimension for deep ultraviolet lithography.

In one embodiment, the etch-resistant material portion 60 can include a dielectric material, and the pair of via structures 80 can be electrically isolated from each other by the materials between the plane of the topmost surface of the pair of via structures 80 and the plane of the bottommost surface of the pair of via structures 80.

Various modifications to the structure of FIGS. 11A and 11B can be derived by eliminating any or all of the at least one underlying material layer (34, 32, 30) and/or by altering the height of the bottom surfaces of the pair of via structures 80. Further, additional modifications to the structure of FIGS. 11A and 11B can be derived by further removing additional material from the topmost surface of the structure of FIGS. 11A and 11B, for example, by chemical mechanical planarization. For example, a chemical mechanical planarization process can proceed until a portion of the contiguous spacer layer 50 is removed without removing any of the template material layer 40, or can proceed until some of the template material layer 40 is removed without fully removing the etch-resistant material portion 60, or can proceed until the etch-resistant material portion 60 is fully removed with or without further removal of portions of the contiguous spacer layer 50 and the template layer 40 between the bottommost surface of the etch-resistant material portion 60 and the topmost surface of the at least one underlying material layer (34, 32, 30).

Figure 12A:
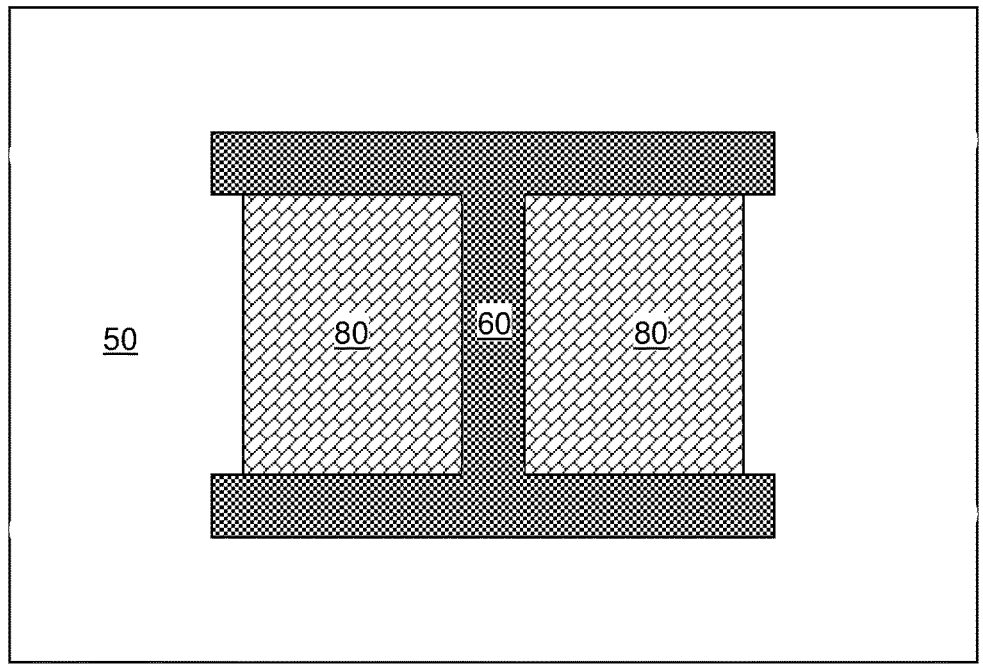
FIG. 12A is a top-down view of a variation of the first exemplary structure according to the first embodiment of the present disclosure.
Figure 12B:
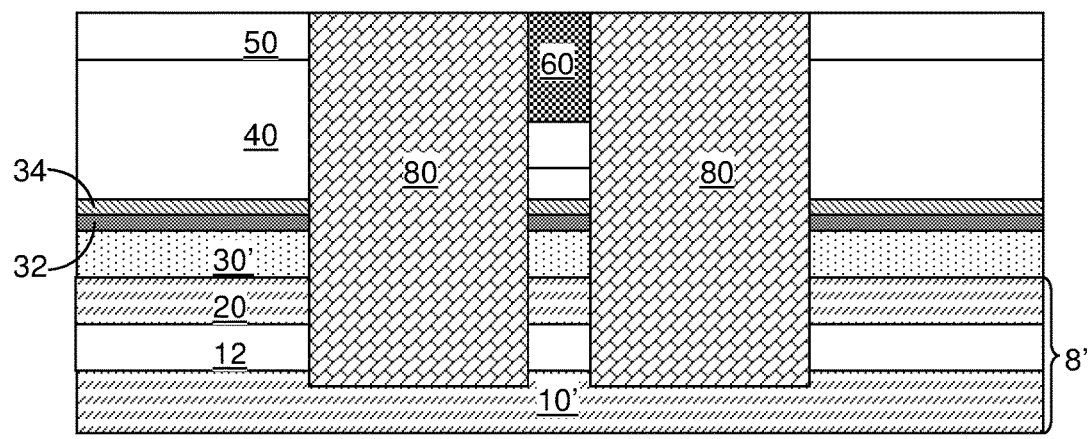
FIG. 12B is a vertical cross-sectional view of the variation of the first exemplary structure of FIG. 12A.

Referring to FIGS. 12A and 12B, a variation of the first exemplary structure can be derived from the first exemplary structure of FIGS. 11A and 11B by employing a semiconductor-on-insulator (SOI) substrate 8' including a handle substrate 10', a buried insulator layer 12, and a top semiconductor layer 30 instead of a semiconductor layer 10.

Figure 13A:
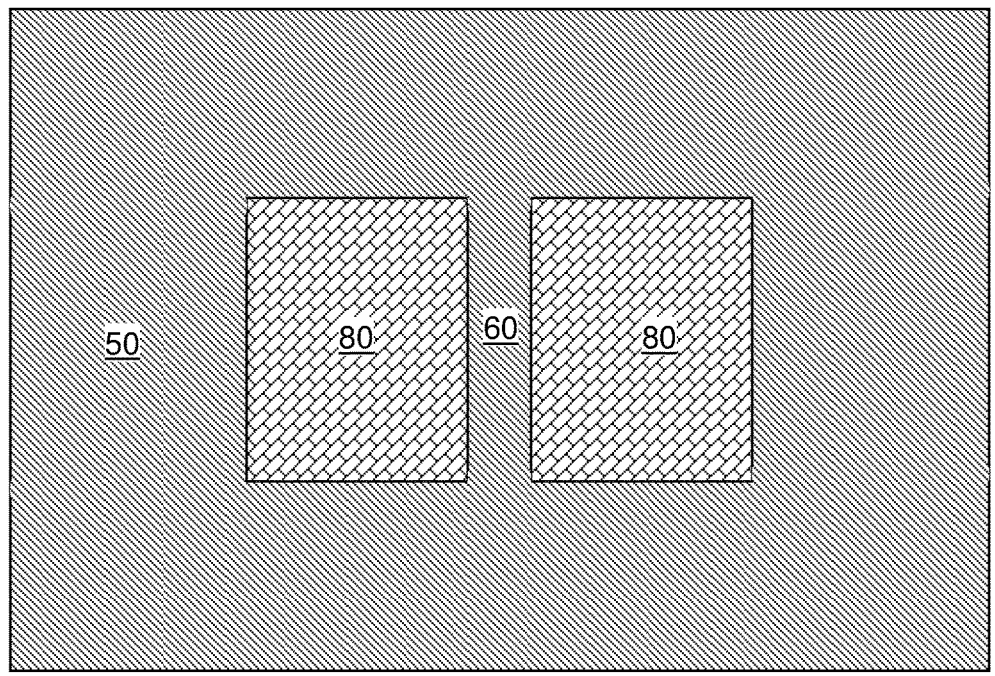
FIG. 13A is a top-down view of a second exemplary structure according to a second embodiment of the present disclosure.
Figure 13B:
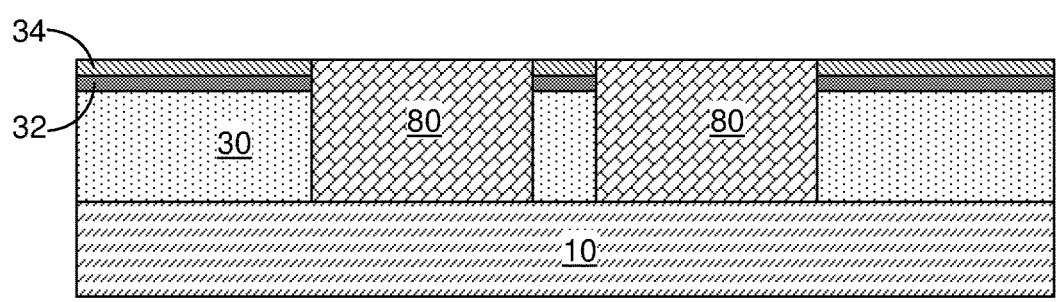
FIG. 13B is a vertical cross-sectional view of the second exemplary structure of FIG. 13A.

Referring to FIGS. 13A and 13B, a second exemplary structure can be derived from the first exemplary structure of FIGS. 11A and 11B by employing a conductive material, such as TiN, TaN, WN, TIC, TaC, WC, Ta, Ti, W, Cu, Al, or an alloy or a combination thereof, for the etch-resistant material portion 60, and subsequently removing the etch-resistant material portion 60. The removal of the etch-resistant material portion 60 can be effected by further planarizing the structure of FIGS. 11A and 11B so that the planarization stops at a height between the height of the bottommost surface of the etch-resistant material portion 60 and the height of the bottommost surface of the pair of via structures 80. For example, the optional hard mask layer 34 can be employed as the stopping layer for the planarization process.

Figure 14A:
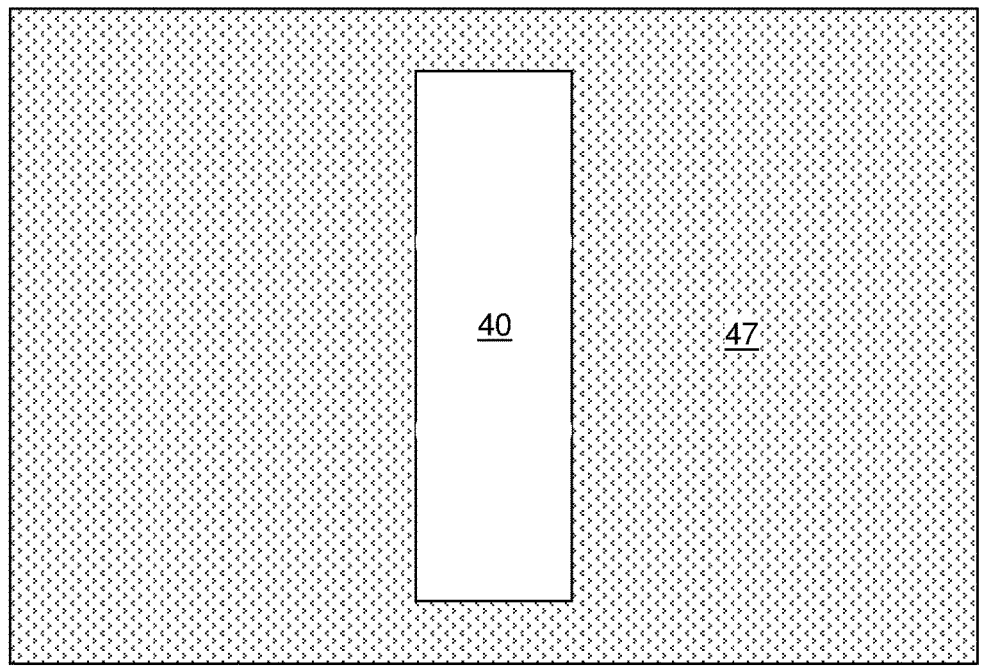
FIG. 14A is a top-down view of a third exemplary structure after transfer of the pattern in the first photoresist layer into a template layer according to a third embodiment of the present disclosure.
Figure 14B:
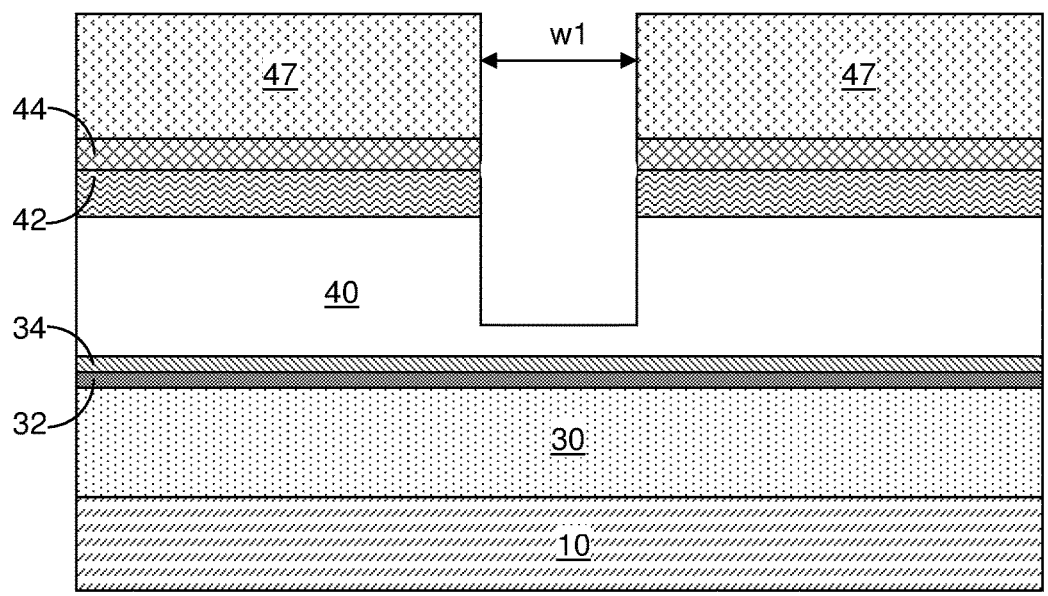
FIG. 14B is a vertical cross-sectional view of the third exemplary structure of FIG. 14A.

Referring to FIGS. 14A and 14B, a third exemplary structure according to a third embodiment of the present disclosure can be derived from the first exemplary structure of FIGS. 1A and 1B by performing the processing steps of FIGS. 2A, 2B, 3A, and 3B with the modification of the first pattern. Specifically, the first pattern is modified to include a substantially rectangular opening having the first width w1. Thus, the H-shaped opening of the first embodiment is modified to include a rectangular opening without the adjoining line shapes.

Figure 15A:
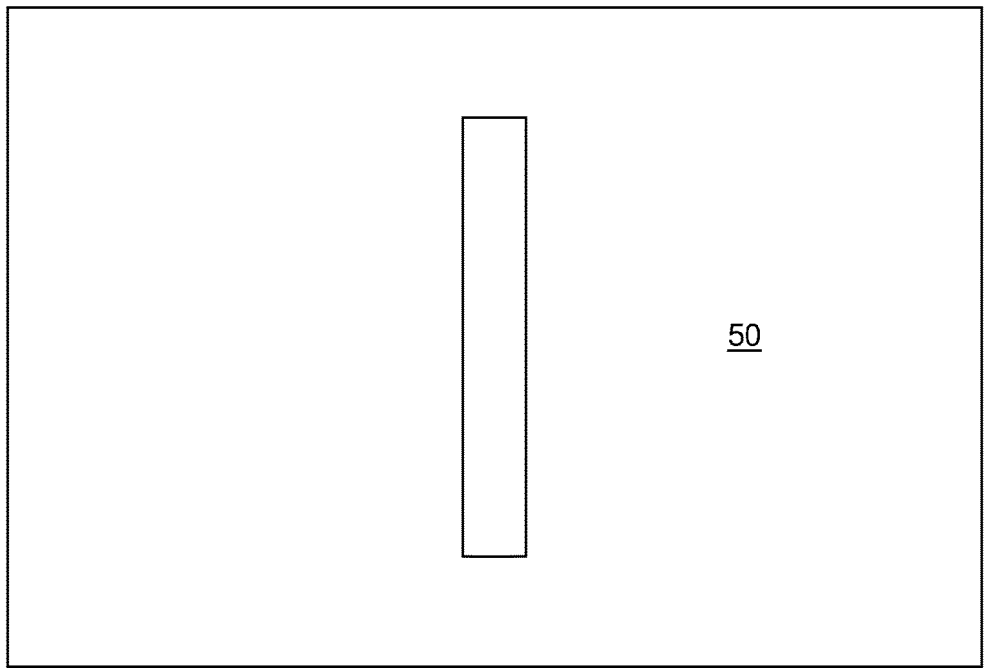
FIG. 15A is a top-down view of the third exemplary structure after formation of a contiguous spacer layer according to the third embodiment of the present disclosure.
Figure 15B:
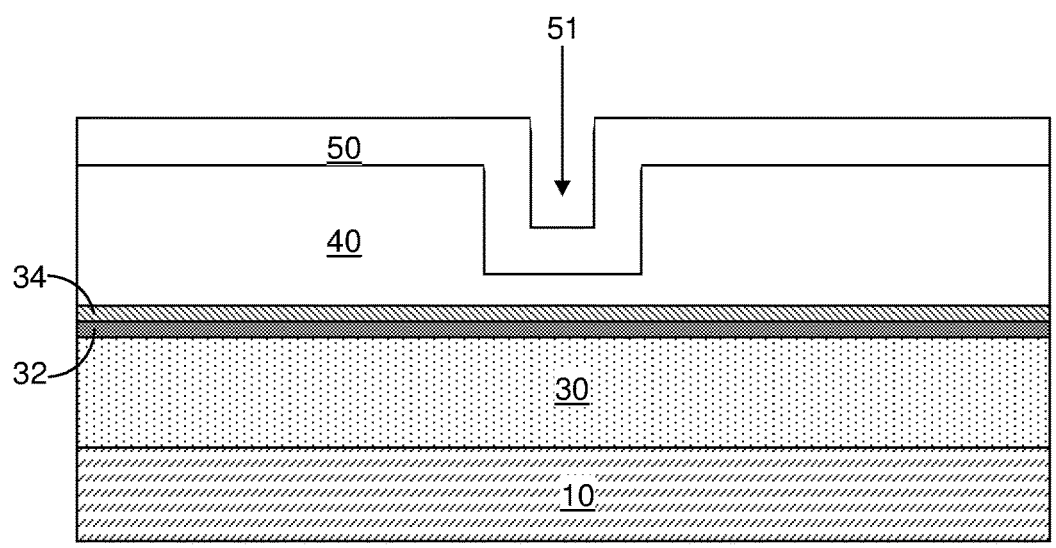
FIG. 15B is a vertical cross-sectional view of the third exemplary structure of FIG. 15A.

Referring to FIGS. 15A and 15B, the processing steps of FIGS. 4A and 4B are performed as in the first embodiment. A rectangular line trench is formed in the template layer 40 such that the lengthwise direction of the rectangular line trench is the same as the lengthwise direction of the rectangular opening in the first photoresist layer 47.

Figure 16A:
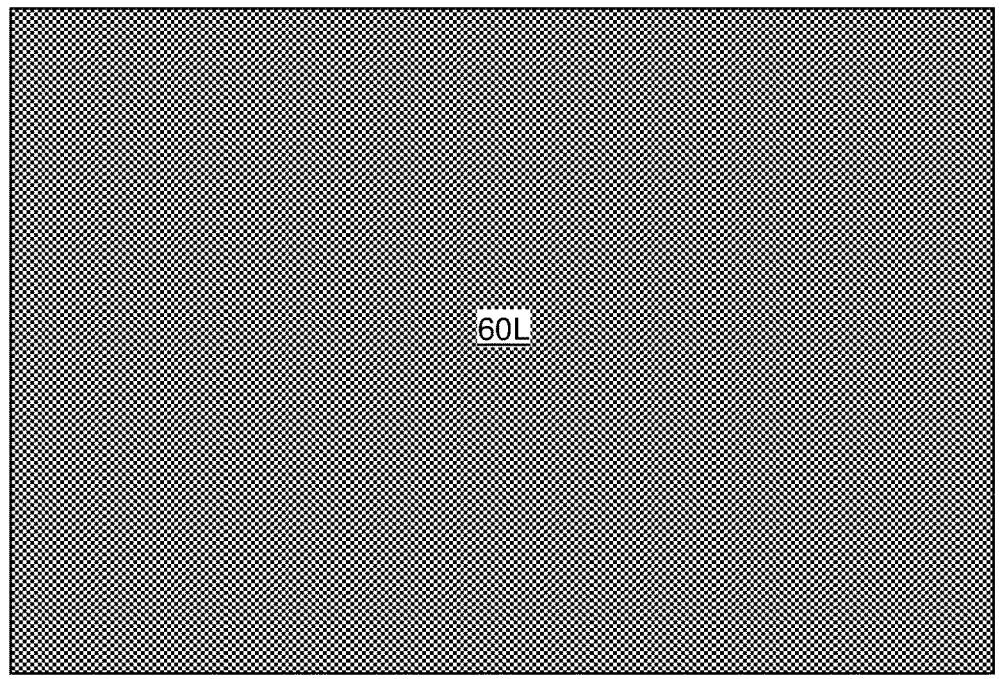
FIG. 16A is a top-down view of the third exemplary structure after formation of an etch-resistant material layer according to the third embodiment of the present disclosure.
Figure 16B:
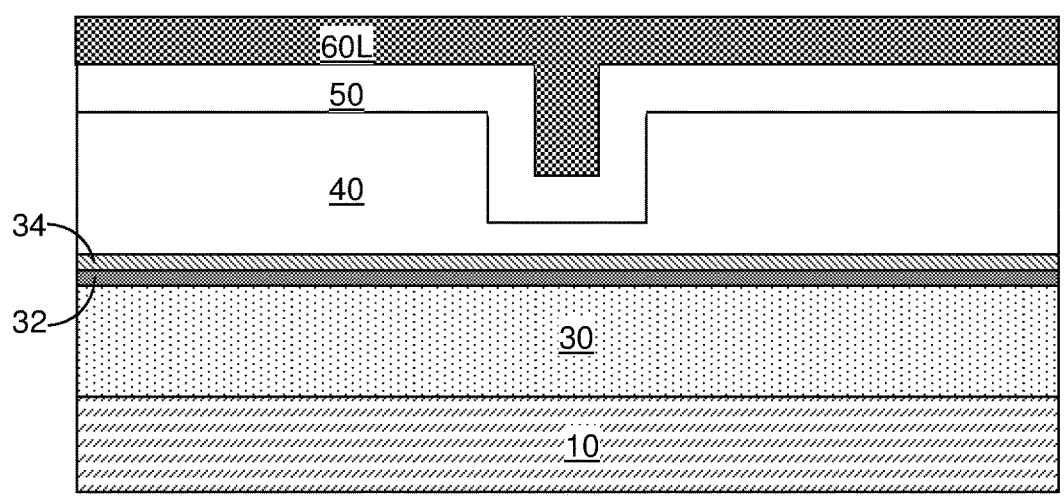
FIG. 16B is a vertical cross-sectional view of the third exemplary structure of FIG. 16A.

Referring to FIGS. 16A and 16B, the processing steps of FIGS. 5A and 5B are performed as in the first embodiment.

Figure 6B:
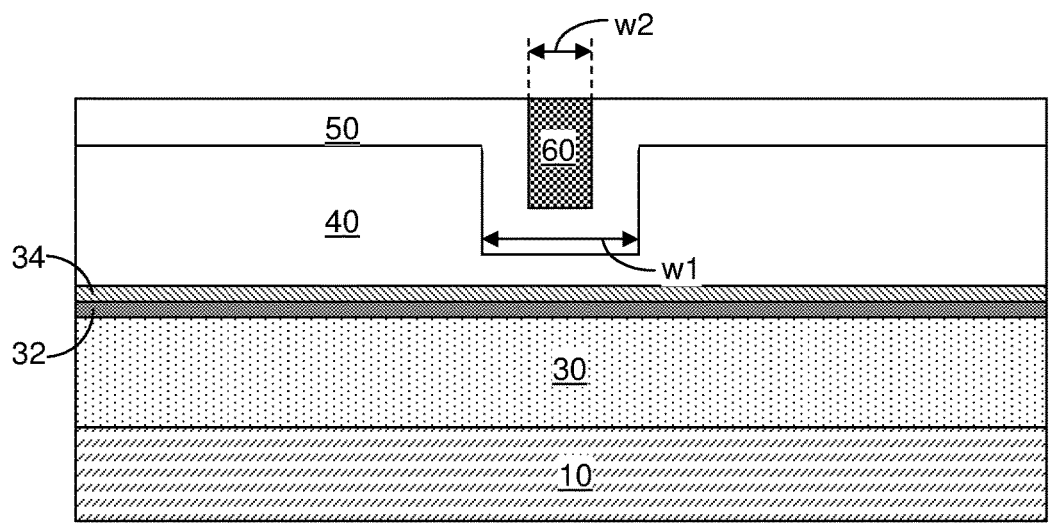
FIG. 6B is a vertical cross-sectional view of the first exemplary structure of FIG. 6A.
Figure 17A:
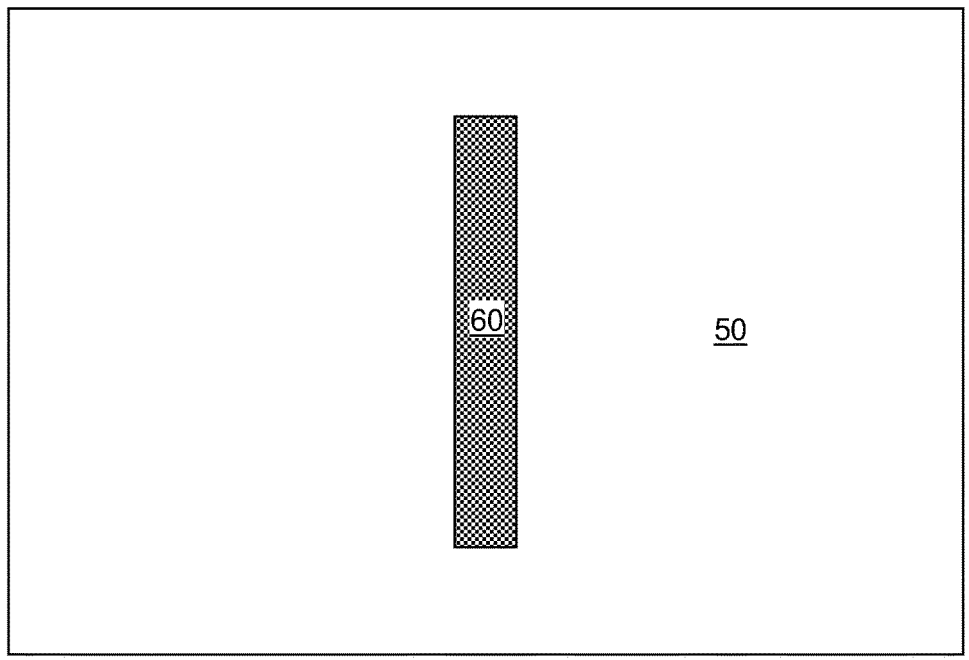
FIG. 17A is a top-down view of the third exemplary structure after recessing of the etch-resistant material layer to form an etch-resistant material portion according to the third embodiment of the present disclosure.
Figure 17B:
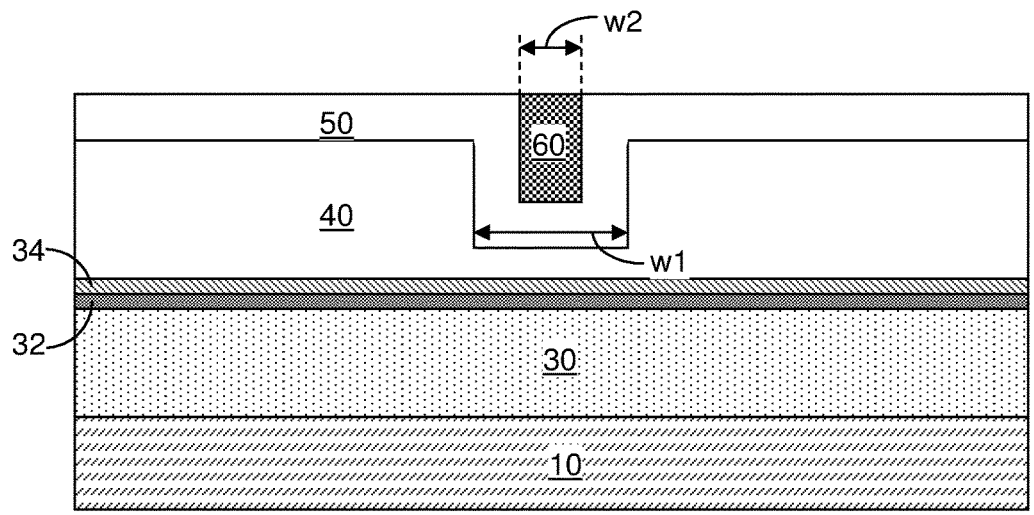
FIG. 17B is a vertical cross-sectional view of the third exemplary structure of FIG. 17A.

Referring to FIGS. 17A and 17B, the processing steps of FIGS. 6A and 6B are performed as in the first embodiment.

Figure 18A:
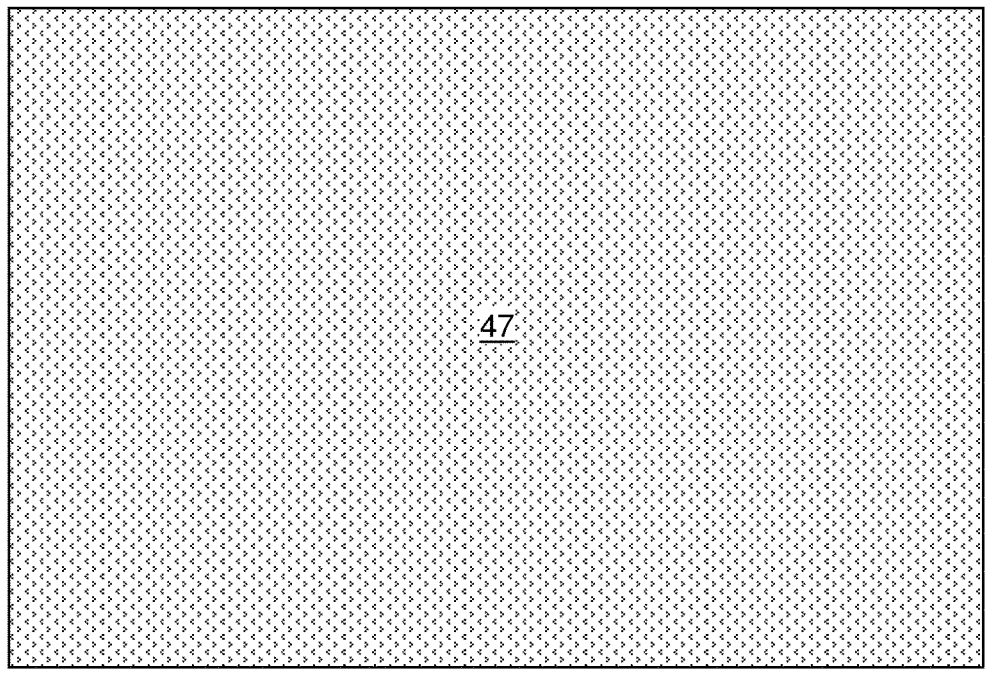
FIG. 18A is a top-down view of the third exemplary structure after application of a third photoresist layer according to the third embodiment of the present disclosure.
Figure 18B:
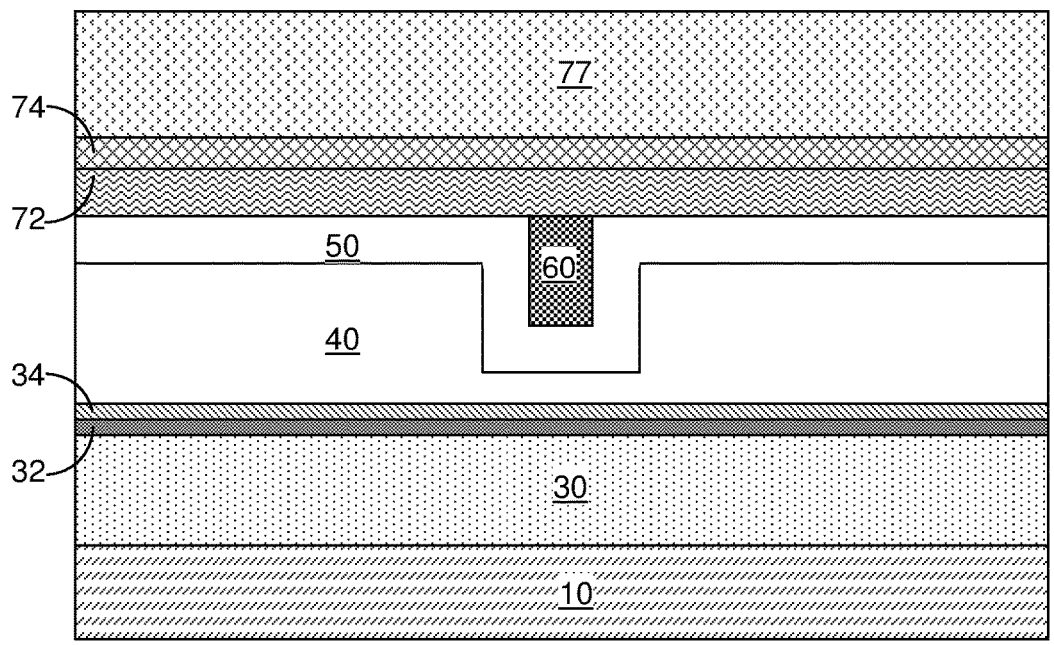
FIG. 18B is a vertical cross-sectional view of the third exemplary structure of FIG. 18A.

Referring to FIGS. 18A and 18B, the processing steps of FIGS. 7A and 7B are performed as in the first embodiment.

Figure 19A:
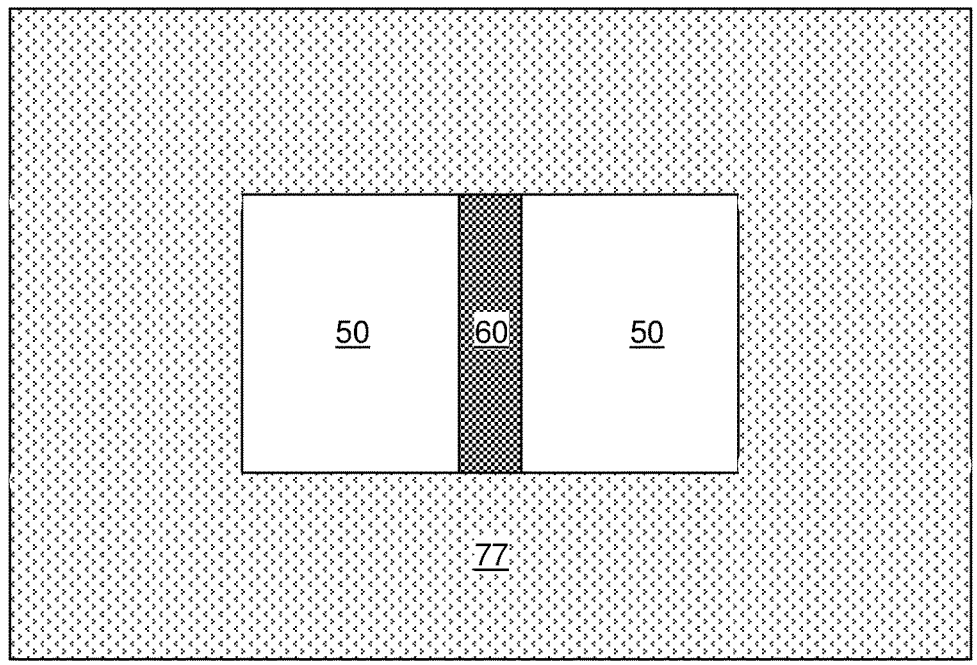
FIG. 19A is a top-down view of the third exemplary structure after patterning the third photoresist layer, a third anti-reflective coating layer, and a third organic planarization layer with a third pattern according to the third embodiment of the present disclosure.
Figure 19B:
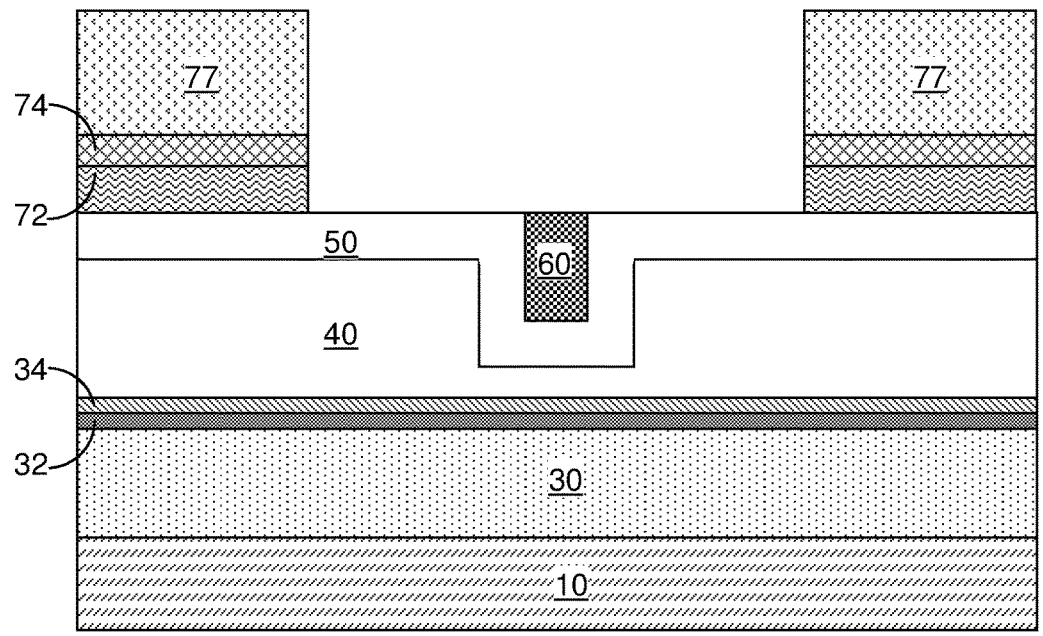
FIG. 19B is a vertical cross-sectional view of the third exemplary structure of FIG. 19A.

Referring to FIGS. 19A and 19B, the processing steps of FIGS. 8A and 8B are performed as in the first embodiment. The etch-resistant material portion 60 of the third embodiment consists of a rectangular line portion and does not include any adjoining line portions that are present in the H-shaped etch-resistant material portion 60 of the first embodiment. In one embodiment, the second opening can have a rectangular shape. A pair of sides of the rectangle is laterally spaced by a region including a center portion of the etch-resistant material portion 60. End portions of the etch-resistant material portion 60 are located outside the area of the rectangle, and are thus covered by the second photoresist 77.

Figure 20A:
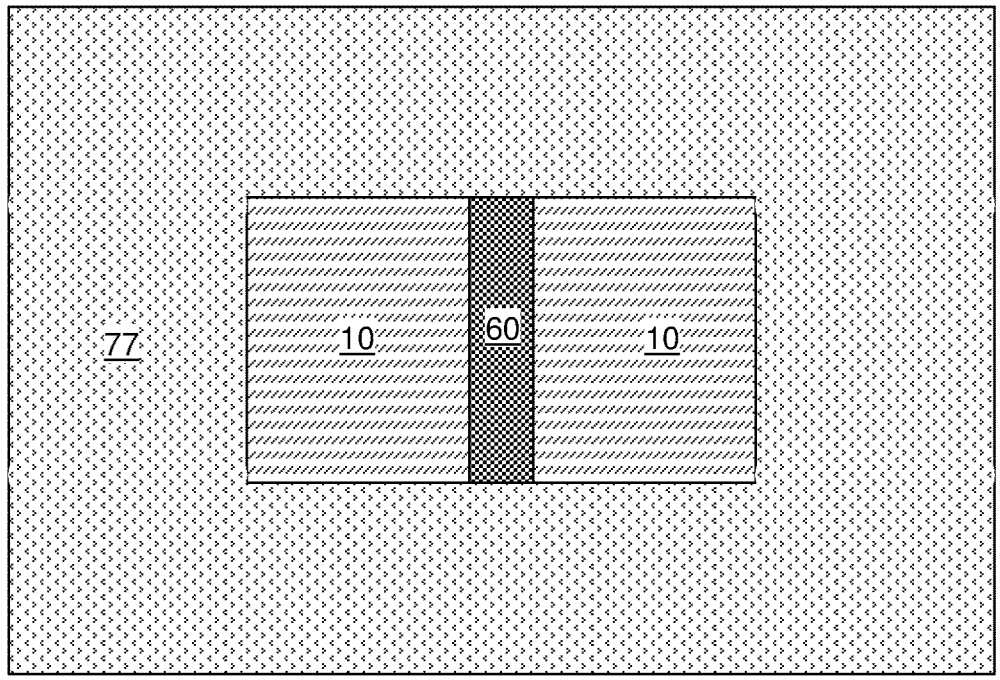
FIG. 20A is a top-down view of the third exemplary structure after transfer of a composite pattern of the intersection of the third pattern and the complement of the pattern of the etch-resistant material portion according to the third embodiment of the present disclosure.
Figure 20B:
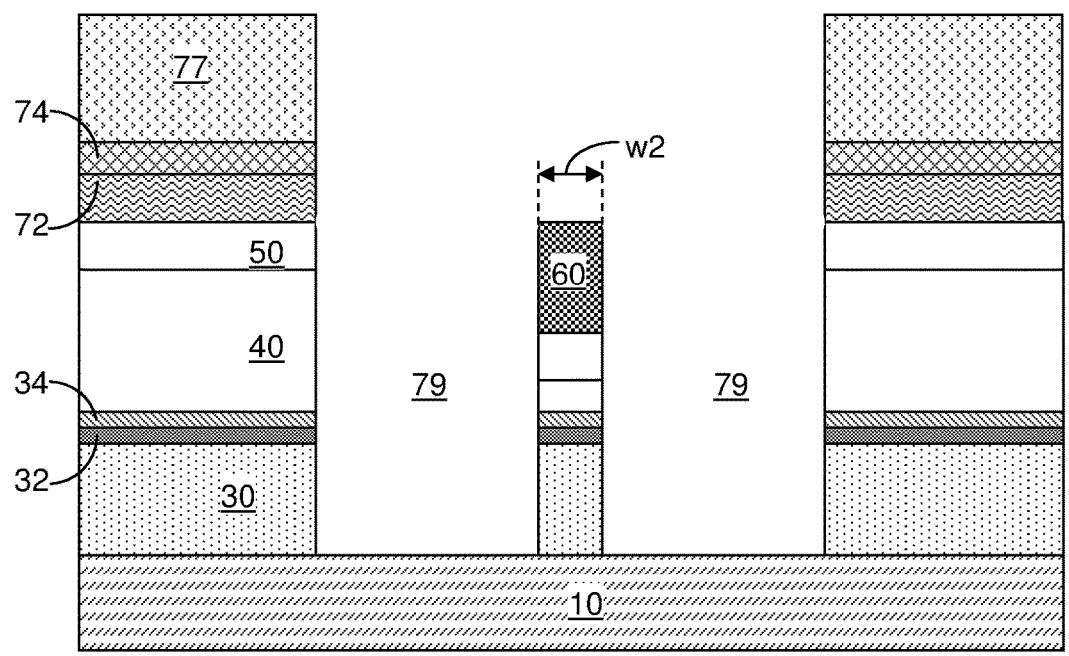
FIG. 20B is a vertical cross-sectional view of the third exemplary structure of FIG. 20A.

Referring to FIGS. 20A and 20B, the processing steps of FIGS. 9A and 9B are performed as in the first embodiment. Because the etch-resistant material portion 60 of the third embodiment is not H-shaped, the lateral extent of the pair of via holes 79 of the third embodiment is not bounded in the lengthwise direction of the etch-resistant material portion 60 by any portion of the etch-resistant material portion 60. The spacing between the pair of the via holes 79 is the same as the width of the etch-resistant material portion 60, i.e., the second width w2.

Figure 21A:
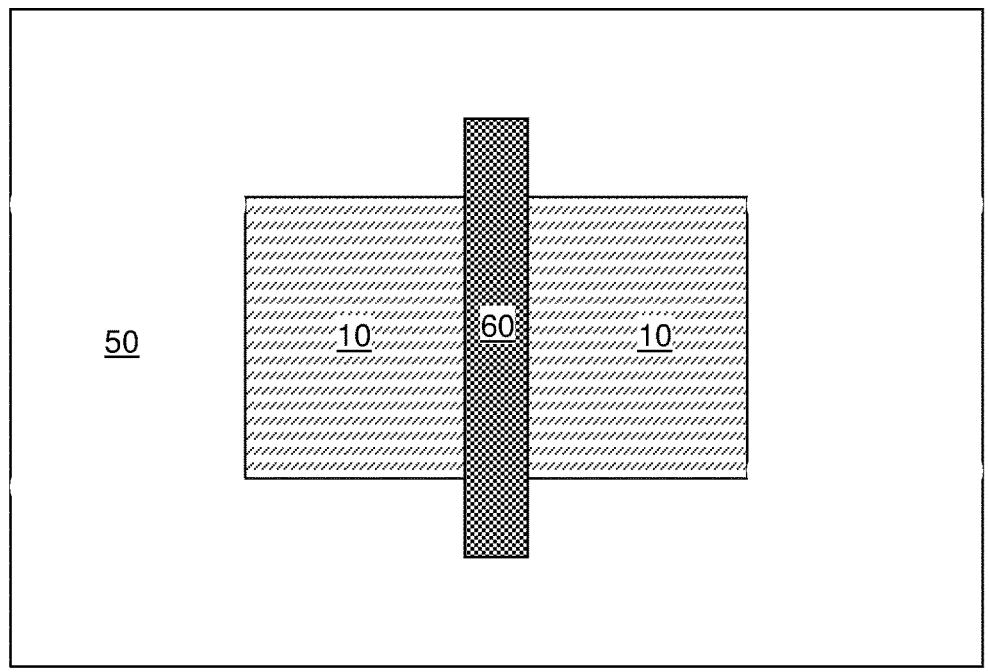
FIG. 21A is a top-down view of the third exemplary structure after removal of the third photoresist layer, the third ARC layer, and the third organic planarization layer according to the third embodiment of the present disclosure.
Figure 21B:
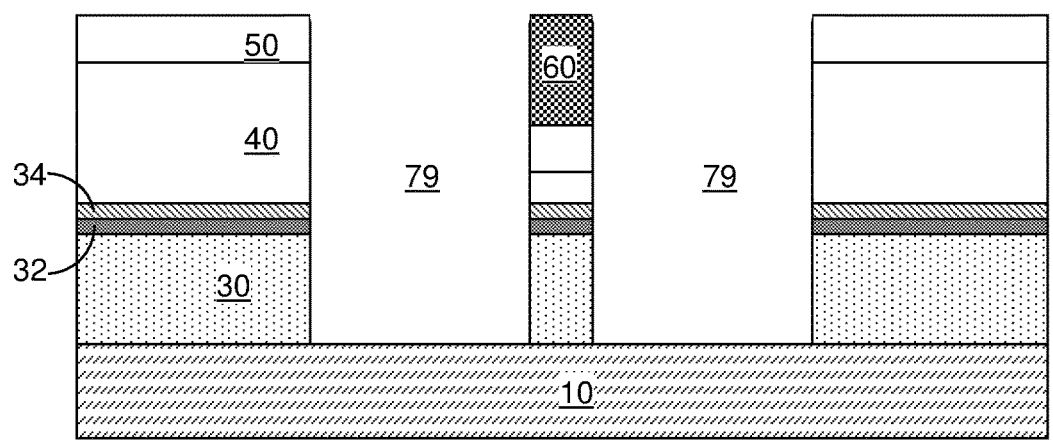
FIG. 21B is a vertical cross-sectional view of the third exemplary structure of FIG. 21A.

Referring to FIGS. 21A and 21B, the processing steps of FIGS. 10A and 10B are performed as in the first embodiment.

Figure 22A:
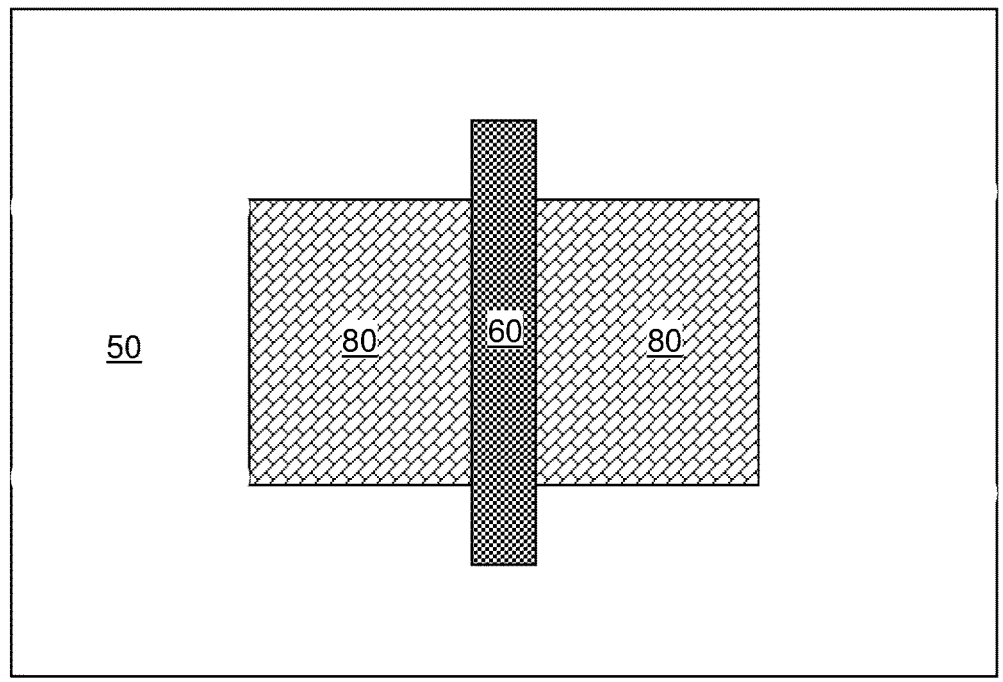
FIG. 22A is a top-down view of the third exemplary structure after formation of a pair of via structures according to the third embodiment of the present disclosure.
Figure 22B:
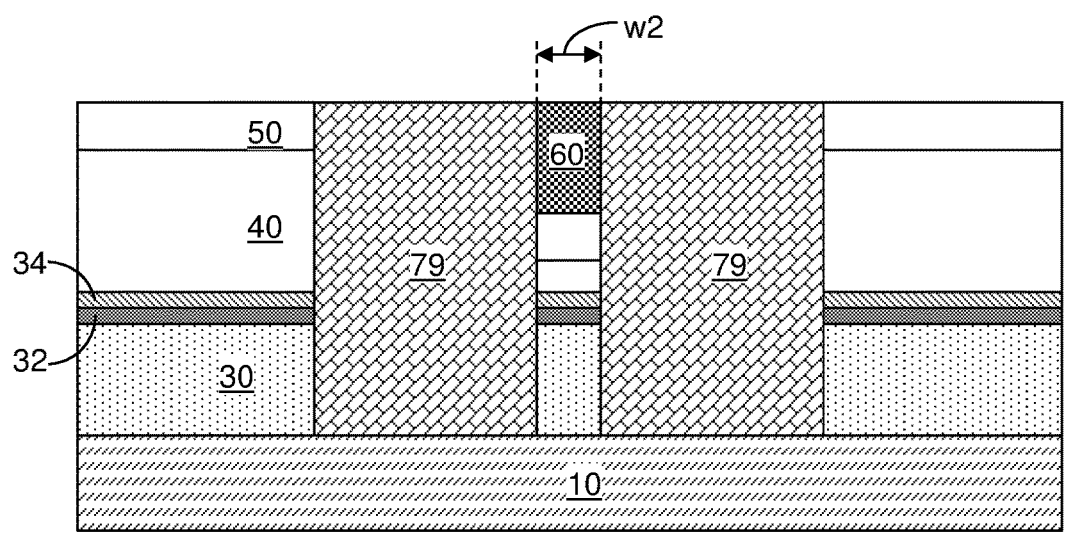
FIG. 22B is a vertical cross-sectional view of the third exemplary structure of FIG. 22A.

Referring to FIGS. 22A and 22B, the processing steps of FIGS. 11A and 11B are performed as in the first embodiment. The etch-resistant material portion 60 has a rectangular shape, and the pair of via structures 80 is separated along a widthwise direction of the rectangular shape. The etch-resistant material portion can have a sub-lithographic lateral dimension for deep ultraviolet lithography such as the second width w2.

Figure 23A:
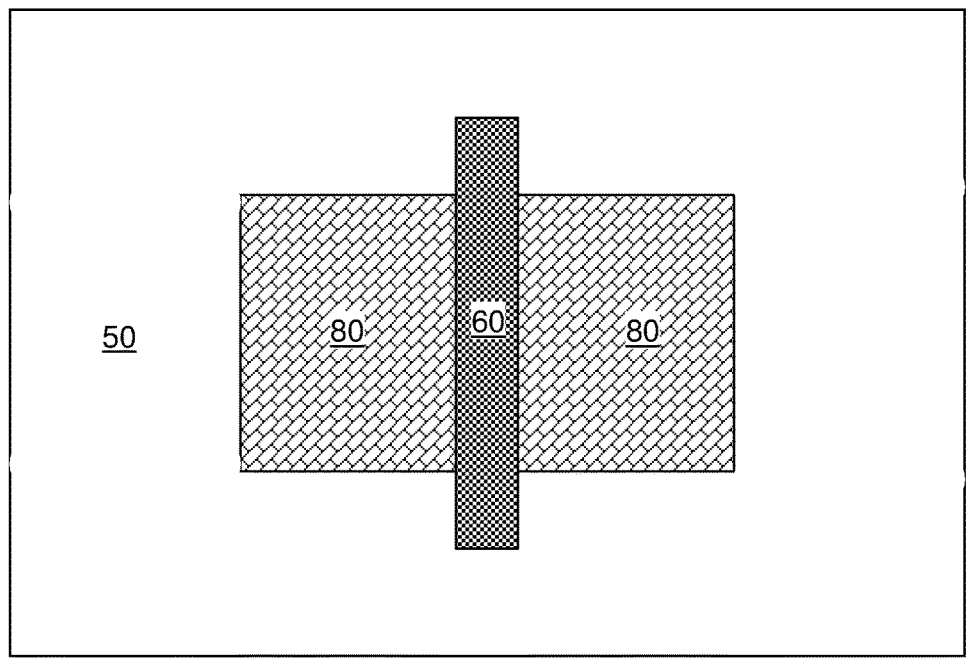
FIG. 23A is a top-down view of a variation of the third exemplary structure according to the third embodiment of the present disclosure.
Figure 23B:
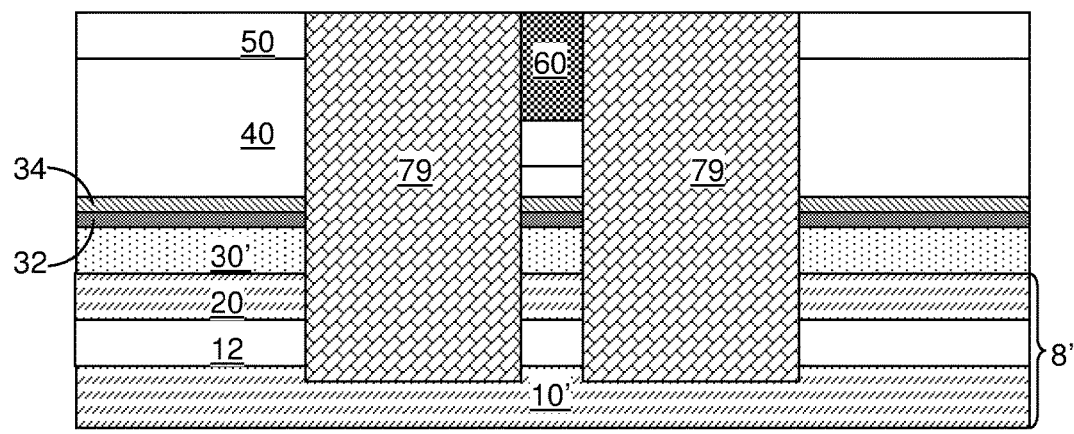
FIG. 23B is a vertical cross-sectional view of the variation of the third exemplary structure of FIG. 23A.

Referring to FIGS. 23A and 23B, a variation of the third exemplary structure can be derived from the third exemplary structure employing the same methods as in the variation of the first exemplary structure illustrated in FIGS. 12A and 12B.

Figure 24A:
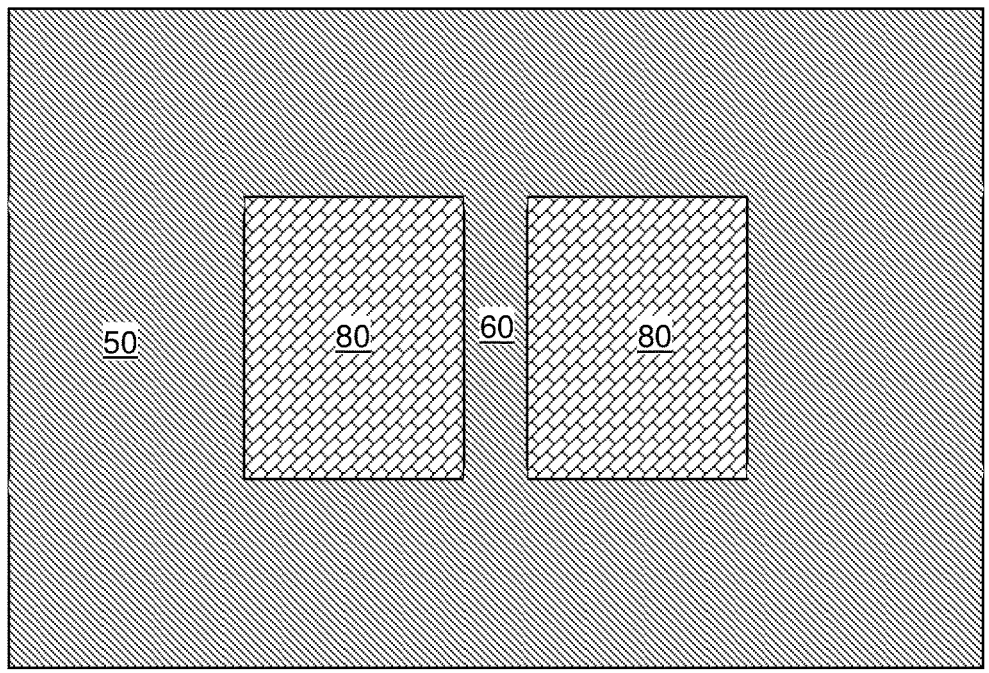
FIG. 24A is a top-down view of a fourth exemplary structure according to a second embodiment of the present disclosure.
Figure 24B:
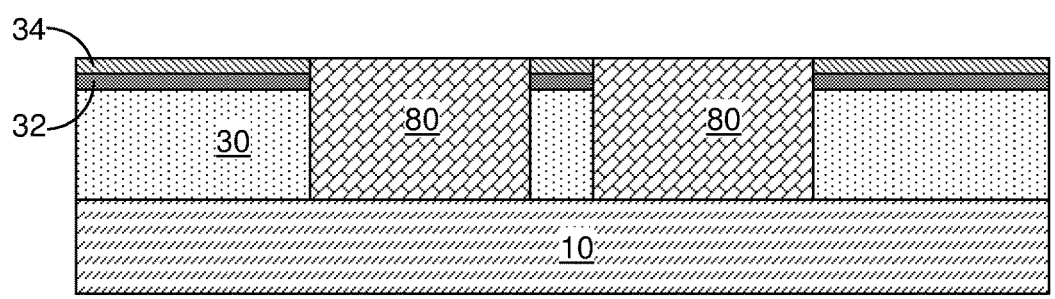
FIG. 24B is a vertical cross-sectional view of the fourth exemplary structure of FIG. 24A.

Referring to FIGS. 24A and 24B, a fourth exemplary structure according to a second embodiment of the present disclosure can be derived from the third exemplary structure employing the same methods as the second embodiment. The fourth exemplary structure can have the same features as the second exemplary structure of FIGS. 13A and 13B.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A structure comprising:
a stack of a template layer and a contiguous spacer layer, wherein said contiguous spacer layer is located on an entire topmost surface of said template layer, and wherein sidewall surfaces of said template layer are vertically aligned to sidewall surfaces of said contiguous spacer layer;
an etch-resistant material portion overlying an entirety of a recessed portion of said stack, wherein said etch resistant material portion has sidewall surfaces that are vertically aligned to sidewall surfaces of said recessed portion of said stack; and
a pair of via structures embedded within said stack and laterally spaced by said etch-resistant material portion and said recessed portion of said stack, wherein a top surface of said contiguous spacer layer, a top surface of said etch-resistant material portion, and top surfaces of said pair of via structures are coplanar among one another, and wherein said etch-resistant material portion has an H-shaped pattern, and a lateral extent of said pair of via structures is bounded by a pair of parallel line portions within said H-shaped pattern.

2. The structure of claim 1, wherein an entirety of said contiguous spacer layer is contiguous, and said contiguous spacer layer has a same thickness in said recessed portion of said template layer as in a non-recessed portion of said template layer.

3. The structure of claim 1, wherein said etch-resistant material portion has a rectangular portion that laterally contacts said pair of via structures.

4. The structure of claim 1, wherein said etch-resistant material portion comprises a dielectric metal oxide.

5. The structure of claim 1, wherein etch-resistant material portion has a sub-lithographic lateral dimension for deep ultraviolet lithography.

6. The structure of claim 1, wherein each of said pair of via structures has three sidewalls in physical contact with sidewalls of said etch-resistant material portion and one sidewall that is not in physical contact with said etch-resistant material portion.

7. The structure of claim 6, wherein each of said three sidewalls is in physical contact with a sidewall of said contiguous spacer layer.

8. The structure of claim 7, wherein each of said three sidewalls is in physical contact with a sidewall of said template layer.

9. The structure of claim 1, wherein a sidewall of one of said pair of via structures and two sidewall surfaces of said etch-resistant material portion are within a same vertical plane.

10. A structure comprising:
a stack of a template layer and a contiguous spacer layer, wherein said contiguous spacer layer is located on an entire topmost surface of said template layer, and wherein sidewall surfaces of said template layer are vertically aligned to sidewall surfaces of said contiguous spacer layer;

an etch-resistant material portion overlying an entirety of a recessed portion of said stack, wherein said etch resistant material portion has sidewall surfaces that are vertically aligned to sidewall surfaces of said recessed portion of said stack; and
a pair of via structures embedded within said stack and laterally spaced by said etch-resistant material portion and said recessed portion of said stack, wherein a top surface of said contiguous spacer layer, a top surface of said etch-resistant material portion, and top surfaces of said pair of via structures are coplanar among one another, and wherein said etch-resistant material portion has a rectangular shape, and said pair of via structures is separated along a widthwise direction of said rectangular shape.

* * * * *